United States Patent
Yoneda

(10) Patent No.: US 12,537,499 B2
(45) Date of Patent: Jan. 27, 2026

(54) ACOUSTIC WAVE DEVICE

(71) Applicant: Murata Manufacturing Co., Ltd., Nagaokakyo (JP)

(72) Inventor: Toshimaro Yoneda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 358 days.

(21) Appl. No.: 18/130,930

(22) Filed: Apr. 5, 2023

(65) Prior Publication Data

US 2023/0327633 A1    Oct. 12, 2023

Related U.S. Application Data

(63) Continuation of application No. PCT/JP2021/037175, filed on Oct. 7, 2021.
(Continued)

(51) Int. Cl.
*H03H 9/02*    (2006.01)
*H03H 9/135*   (2006.01)
(Continued)

(52) U.S. Cl.
CPC ........ *H03H 9/02015* (2013.01); *H03H 9/135* (2013.01); *H03H 9/17* (2013.01); *H03H 9/568* (2013.01)

(58) Field of Classification Search
CPC ...... H03H 9/02015; H03H 9/135; H03H 9/17; H03H 9/568; H03H 9/14594; H03H 9/0542; H03H 9/132; H03H 9/02228
(Continued)

(56) References Cited

U.S. PATENT DOCUMENTS 9,124,240 B2 *   9/2015   Shimizu ............. H03H 9/14594
2010/0223999 A1  9/2010   Onoe
(Continued)

FOREIGN PATENT DOCUMENTS

JP    2010233210 A    10/2010
JP    2012257019 A    12/2012
(Continued)

OTHER PUBLICATIONS

International Search Report in PCT/JP2021/037175, mailed Dec. 21, 2021, 4 pages.
(Continued)

*Primary Examiner* — Jorge L Salazar, Jr.
(74) *Attorney, Agent, or Firm* — Keating & Bennett, LLP

(57) ABSTRACT

An acoustic wave device includes first and second piezoelectric layers including lithium niobate or lithium tantalate, a pair of first and second electrodes on a first principal surface of the first piezoelectric layer, and a pair of third and fourth electrodes on a first principal surface of the second piezoelectric layer, wherein the first piezoelectric layer and the first and second electrodes define a first acoustic wave resonator, the second piezoelectric layer and the third and fourth electrodes define a second acoustic wave resonator, and an angle between a crystal orientation of the first piezoelectric layer and a direction perpendicular or substantially perpendicular to a lengthwise direction of the pair of the first and second electrodes is different from an angle between a crystal orientation of the second piezoelectric layer and a direction perpendicular or substantially perpendicular to a lengthwise direction of the pair of the third and fourth electrodes.

25 Claims, 16 Drawing Sheets

Related U.S. Application Data

(60) Provisional application No. 63/089,121, filed on Oct. 8, 2020.

(51) Int. Cl.
  *H03H 9/17* (2006.01)
  *H03H 9/56* (2006.01)

(58) Field of Classification Search
  USPC .................................................. 333/193–196
  See application file for complete search history.

(56) References Cited

U.S. PATENT DOCUMENTS

| | | |
|---|---|---|
| 2011/0090026 A1 | 4/2011 | Nakahashi et al. |
| 2013/0057360 A1 | 3/2013 | Meltaus et al. |
| 2015/0365069 A1 | 12/2015 | Durner et al. |
| 2017/0353173 A1 | 12/2017 | Sakurai et al. |
| 2019/0305751 A1 | 10/2019 | Mimura |
| 2019/0386635 A1 | 12/2019 | Plesski et al. |
| 2020/0220518 A1 | 7/2020 | Omura |
| 2020/0295734 A1 | 9/2020 | Urata |
| 2022/0069803 A1 | 3/2022 | Nozoe |

FOREIGN PATENT DOCUMENTS

| | | |
|---|---|---|
| JP | 2013528996 A | 7/2013 |
| JP | 2016510963 A | 4/2016 |
| JP | 2017220778 A | 12/2017 |
| WO | 2010001522 A1 | 1/2010 |
| WO | 2018116602 A1 | 6/2018 |
| WO | 2019065666 A1 | 4/2019 |
| WO | 2019107280 A1 | 6/2019 |
| WO | 2020130128 A1 | 6/2020 |

OTHER PUBLICATIONS

Written Opinion in PCT/JP2021/037175, mailed Dec. 21, 2021, 8 pages.

* cited by examiner

ACOUSTIC WAVE DEVICE

CROSS REFERENCE TO RELATED APPLICATIONS

This application claims the benefit of priority to Provisional Application No. 63/089,121 filed on Oct. 8, 2020 and is a Continuation Application of PCT Application No. PCT/JP2021/037175 filed on Oct. 7, 2021. The entire contents of each application are hereby incorporated herein by reference.

BACKGROUND OF THE INVENTION

1. Field of the Invention

The present invention relates to an acoustic wave device with a piezoelectric layer including lithium niobate or lithium tantalate.

2. Description of the Related Art

Japanese Unexamined Patent Application Publication No. 2012-257019 discloses an acoustic wave device.

In the acoustic wave device disclosed in Japanese Unexamined Patent Application Publication No. 2012-257019, there is a possibility that spurious waves may generate in modes other than a main mode utilized by a filter and filter characteristics may deteriorate.

SUMMARY OF THE INVENTION

Preferred embodiments of the present invention provide acoustic wave devices that are each able to reduce or prevent spurious modes.

An acoustic wave device according to a preferred embodiment of the present invention includes a first piezoelectric layer and a second piezoelectric layer each made of lithium niobate or lithium tantalate and including a first principal surface and a second principal surface opposed to the first principal surface in a thickness direction, at least one pair of a first electrode and a second electrode on the first principal surface of the first piezoelectric layer and opposed to each other in a planar direction of the first principal surface, and at least one pair of a third electrode and a fourth electrode on the first principal surface of the second piezoelectric layer and opposed to each other in a planar direction of the first principal surface, wherein the first piezoelectric layer and the pair of the first electrode and the second electrode define a first acoustic wave resonator, the second piezoelectric layer and the pair of the third electrode and the fourth electrode define a second acoustic wave resonator, and an angle between a crystal orientation of the first piezoelectric layer and a direction perpendicular or substantially perpendicular to a lengthwise direction of the pair of the first electrode and the second electrode is different from an angle between a crystal orientation of the second piezoelectric layer and a direction perpendicular or substantially perpendicular to a lengthwise direction of the pair of the third electrode and the fourth electrode.

An acoustic wave device according to a preferred embodiment of the present invention includes a first piezoelectric layer and a second piezoelectric layer each made of lithium niobate or lithium tantalate and including a first principal surface and a second principal opposed to the first principal surface in a thickness direction, at least one pair of a first electrode and a second electrode on the first principal surface of the first piezoelectric layer and opposed to each other in a planar direction of the first principal surface, and at least one pair of a third electrode and a fourth electrode on the first principal surface of the second piezoelectric layer and opposed to each other in a planar direction of the first principal surface, wherein the first piezoelectric layer and the pair of the first electrode and the second electrode define a first acoustic wave resonator, the second piezoelectric layer and the pair of the third electrode and the fourth electrode define a second acoustic wave resonator, d/p is about 0.5 or less where an average thickness of each of the first piezoelectric layer and the second piezoelectric layer is denoted by d and center-to-center distances between the first electrode and the second electrode adjacent to each other and between the third electrode and the fourth electrode adjacent to each other are each denoted by p, and an angle between a crystal orientation of the first piezoelectric layer and a direction perpendicular or substantially perpendicular to a lengthwise direction of the pair of the first electrode and the second electrode is different from an angle between a crystal orientation of the second piezoelectric layer and a direction perpendicular or substantially perpendicular to a lengthwise direction of the pair of the third electrode and the fourth electrode.

According to preferred embodiments of the present invention, spurious waves are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the drawings. The scope of the present disclosure is not limited by the following preferred embodiments. The preferred embodiments disclosed herein are merely illustrative. In modifications preferred embodiments subsequent to a second preferred embodiment in which configurations can be partially replaced or combined between the different preferred embodiments, description of matters common to those in a first preferred embodiment is omitted, and only different points are explained. Especially, similar operations and advantageous effects obtained with similar configurations are not explained repeatedly in each of the preferred embodiments.

First Preferred Embodiment

Figure 1A:
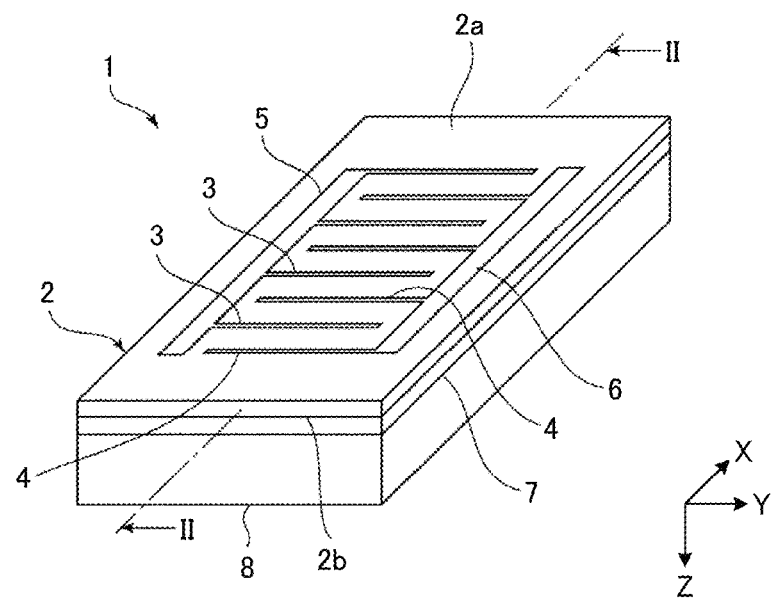
FIG. 1A is a perspective view of an acoustic wave device of a first preferred embodiment of the present invention.

FIG. 1A is a perspective view of an acoustic wave device of a first preferred embodiment of the present invention.

Figure 1B:
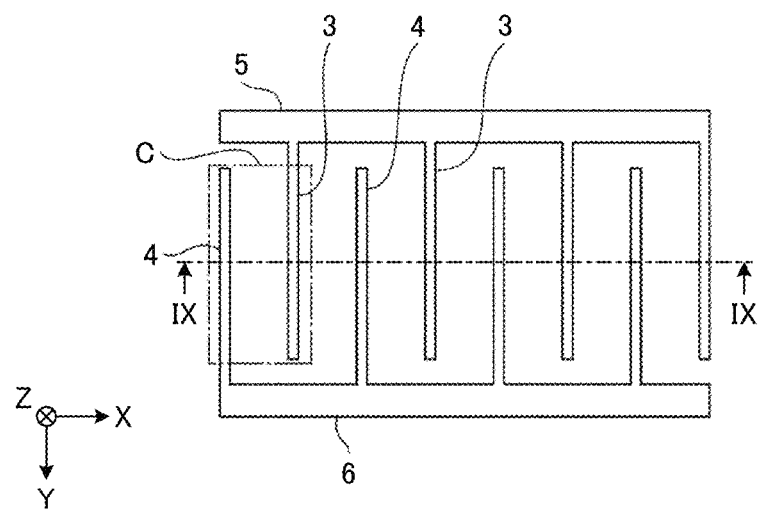
FIG. 1B is a plan view illustrating an electrode structure in the first preferred embodiment of the present invention.

FIG. 1B is a plan view illustrating an electrode structure in the first preferred embodiment.

The acoustic wave device 1 of the first preferred embodiment includes a piezoelectric layer 2 made of, for example, $LiNbO_3$. The piezoelectric layer 2 may be made of, for example, $LiTaO_3$. Cut angles of $LiNbO_3$ or $LiTaO_3$ are given by Z cut in the first preferred embodiment. The cut angles of $LiNbO_3$ or $LiTaO_3$ may be given by rotated Y cut or X cut. A propagation direction is preferably Y propagation or X propagation ±about 30°, for example.

A thickness of the piezoelectric layer 2 is not limited to a particular value but is preferably, for example, about 50 nm or more and about 1000 nm or less from the viewpoint of effectively exciting a thickness shear mode.

The piezoelectric layer 2 includes a first principal surface 2a and a second principal surface 2b opposed to each other in a Z-direction. An electrode 3 and an electrode 4 are disposed on the first principal surface 2a.

Here, the electrode 3 is an example of a "first electrode", and the electrode 4 is an example of a "second electrode". In FIGS. 1A and 1B, a plurality of the electrodes 3 are connected to a first busbar 5. A plurality of the electrodes 4 are connected to a second busbar 6. The electrodes 3 and the electrodes 4 are interdigitated with each other.

The electrode 3 and the electrode 4 have a rectangular or substantially rectangular shape and extend in a lengthwise direction. The electrode 3 and the electrode 4 adjacent to the electrode 3 are opposed to each other in a direction perpendicular or substantially perpendicular to the lengthwise direction. The lengthwise direction of the electrode 3 and the electrode 4 and the direction perpendicular or substantially perpendicular to the lengthwise direction of the lengthwise direction of the electrode 3 and the electrode 4 are each a direction intersecting a thickness direction of the piezoelectric layer 2. Therefore, it can also be said that the electrode 3 and the electrode 4 adjacent to the electrode 3 are opposed to each other in the direction intersecting the thickness direction of the piezoelectric layer 2. In the following direction, the thickness direction of the piezoelectric layer 2 is called the Z-direction, the direction perpendicular or substantially perpendicular to the lengthwise direction of the electrode 3 and the electrode 4 is called an X-direction, and the lengthwise direction of the electrode 3 and the electrode 4 is called a Y-direction in some cases.

Alternatively, the lengthwise direction of the electrode 3 and the electrode 4 may be replaced with the direction perpendicular or substantially perpendicular to the lengthwise direction of the electrode 3 and the electrode 4 illustrated in FIGS. 1A and 1B. Stated another way, in FIGS. 1A and 1B, the electrode 3 and the electrode 4 may extend in a direction in which the first busbar 5 and the second busbar 6 extend. In that case, the first busbar 5 and the second busbar 6 extend in the same direction as the direction in which the electrode 3 and the electrode 4 extend in FIGS. 1A and 1B. Moreover, multiple pairs of structures in each of which the electrode 3 connected to one potential and the electrode 4 connected to the other potential are adjacent to each other are disposed in the direction perpendicular or substantially perpendicular to the lengthwise direction of the electrode 3 and the electrode 4.

Here, the wording "the electrode 3 and the electrode 4 are adjacent to each other" indicates the case in which the electrode 3 and the electrode 4 are arranged with a gap interposed therebetween, not the case in which the electrode 3 and the electrode 4 are in direct contact with each other. Furthermore, when the electrode 3 and the electrode 4 are adjacent to each other, any other electrode connected to a hot electrode or a ground electrode, including any of the other electrodes 3 and electrodes 4, is not disposed between the electrode 3 and the electrode 4. The number of the pairs of the adjacent electrodes is not required to be an integer and may be 1.5 or 2.5.

A center-to-center distance, namely a pitch, between the electrode 3 and the electrode 4 is preferably in a range of, for example, about 1 μm or more and about 10 μm or less. The wording "center-to-center distance between the electrode 3 and the electrode 4" indicates a distance spanning between the center of a width of the electrode 3 in the direction perpendicular or substantially perpendicular to the lengthwise direction of the electrode 3 and the center of a width of the electrode 4 in the direction perpendicular or substantially perpendicular to the lengthwise direction of the electrode 4.

When at least one of the electrode 3 and the electrode 4 is disposed as a multiple number of electrodes (namely, when 1.5 or more pairs of the electrodes are disposed on an assumption that the electrode 3 and the electrode 4 constitute one pair), the center-to-center distance between the electrode 3 and the electrode 4 indicates an average value of center-to-center distances between adjacent twos among the 1.5 or more pairs of the electrode(s) 3 and the electrode(s) 4.

A width of each of the electrode 3 and the electrode 4, namely a dimension of each of the electrode 3 and the electrode 4 along an opposing direction in which both the electrodes are opposed to each other, is preferably in a range of, for example, about 150 nm or more and about 1000 nm or less.

In the first preferred embodiment, because the Z-cut piezoelectric layer is used, the direction perpendicular or substantially perpendicular to the lengthwise direction of the electrode 3 and the electrode 4 is a direction perpendicular or substantially perpendicular to a polarization direction of the piezoelectric layer 2. This is not applied to the case in which a piezoelectric substance with other cut-angles is used as the piezoelectric layer 2. Here, the word "perpendicular" indicates not only the case in which two directions are exactly perpendicular to each other, but also the case in which two directions are substantially perpendicular to each other (specifically, in which an angle between the direction perpendicular or substantially perpendicular to the lengthwise direction of the electrode 3 and the electrode 4 and the polarization direction is, for example, about 90°±10°.

Figure 2:
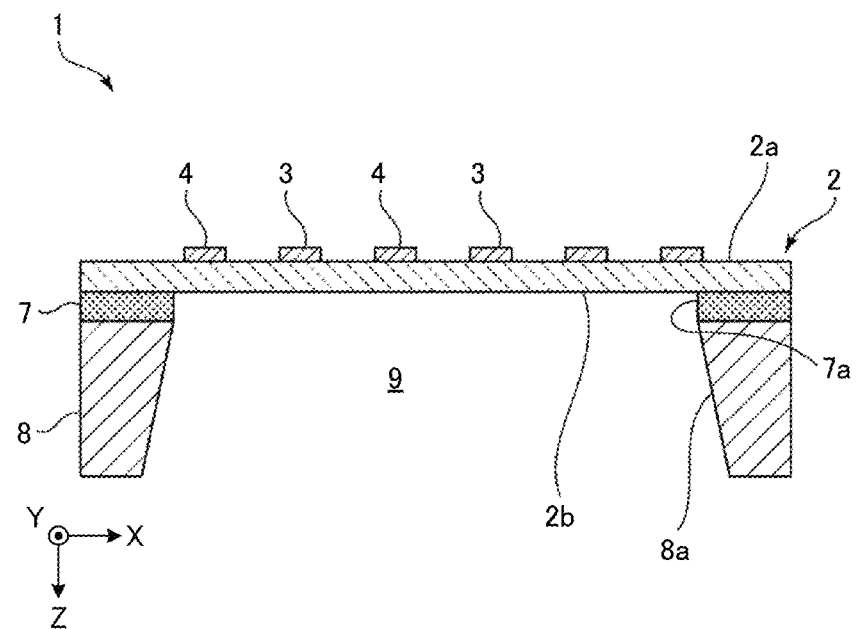
FIG. 2 is a sectional view taken along a cross-section denoted by a line II-II in FIG. 1A.

FIG. 2 is a sectional view taken along a cross-section denoted by a line II-II in FIG. 1A. A support member 8 (support substrate) is stacked on the second principal surface 2b side of the piezoelectric layer 2 with an intermediate layer 7 interposed therebetween. The intermediate layer 7 and the support member 8 have a frame shape and include apertures 7a and 8a, respectively, as illustrated in FIG. 2. A cavity 9 (airgap) is defined by those apertures.

The cavity 9 does not impede vibration of the piezoelectric layer 2 in an excitation region C. From that point of view, the support member 8 is stacked on the second principal surface 2b with the intermediate layer 7 interposed therebetween at a position not overlapping with a portion in which at least one pair of the electrode 3 and the electrode 4 are disposed. The intermediate layer 7 is not always required to be provided. Thus, the support member 8 may be directly or indirectly stacked on the second principal surface 2b of the piezoelectric layer 2.

The intermediate layer 7 is an insulating layer and is made of, for example, silicon oxide. The intermediate layer 7 can be made of, instead of silicon oxide, any other suitable insulating material such as, for example, silicon oxynitride or alumina.

The support member 8 is also called a support substrate and is made of, for example, Si. The plane orientation of a Si surface on a side closer to the piezoelectric layer 2 may be any of (100), (110), and (111). Preferably, for example, high-resistance Si with a resistivity of about 4 kQ or more is used. The support member 8 can also be made of any other suitable insulating material or a semiconductor material. For example, piezoelectric substances such as aluminum oxide, lithium tantalate, lithium niobate, and quartz, various types of ceramics such as alumina, magnesia, sapphire, silicon nitride, aluminum nitride, silicon carbide, zirconia, cordierite, mullite, steatite, and forsterite, dielectrics such as diamond and glass, and semiconductors such as gallium nitride can be used as materials of the support member 8.

The electrode 3, the electrode 4, the first busbar 5, and the second busbar 6 are made of an appropriate metal or alloy, such as, for example, Al or an AlCu alloy. In the first preferred embodiment, the electrode 3, the electrode 4, the first busbar 5, and the second busbar 6 have a structure in which, for example, an Al film is laminated on a Ti film. Instead, an adhesion layer other than the Ti film may also be used.

When the acoustic wave device 1 is driven, an AC voltage is applied between the electrode 3 and the electrode 4. More specifically, an AC voltage is applied between the first busbar 5 and the second busbar 6. As a result, resonance characteristics can be obtained with utilization of a bulk wave in the thickness shear mode excited in the piezoelectric layer 2.

In the acoustic wave device 1, assuming that the thickness of the piezoelectric layer 2 is denoted by d and the center-to-center distance between any adjacent two among the multiple pairs of the electrode 3 and the electrode 4 is denoted by p, d/p is set to be, for example, about 0.5 or less. Under that condition, the bulk wave in the thickness shear mode can be effectively excited, and good resonance characteristics can be obtained. More preferably, d/p is set to be, for example, about 0.24 or less. In such a case, more satisfactory resonance characteristics can be obtained.

When at least one of the electrode 3 and the electrode 4 is disposed as a multiple number of electrodes like the first preferred embodiment, namely when 1.5 or more pairs of the electrode(s) 3 and the electrode(s) 4 are disposed on an assumption that the electrode 3 and the electrode 4 define one pair, the center-to-center distance p between the electrode 3 and the electrode 4 indicates the average value of the center-to-center distances between adjacent twos among the electrode(s) 3 and the electrode(s) 4.

With the configuration described above, in the acoustic wave device 1 of the first preferred embodiment, even when the number of pairs of the electrodes 3 and the electrodes 4 is reduced to achieve a reduction in size, a fall of the Q-value is less likely to occur. This is because the resonator does not need reflectors to be disposed on both sides and a propagation loss is small. The reason why the reflectors are not needed is because the bulk wave in the thickness shear mode is utilized.

Figure 3A:
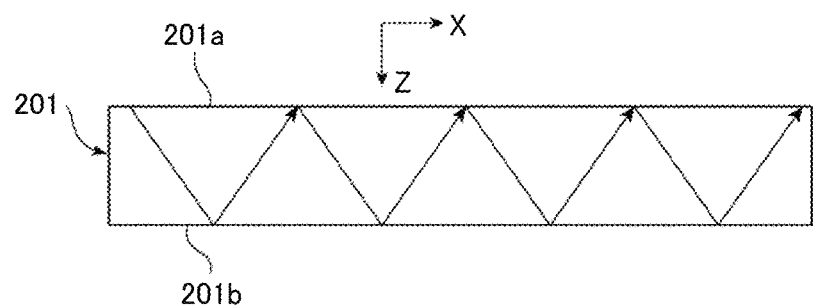
FIG. 3A is a schematic sectional view to explain a Lamb wave propagating in a piezoelectric layer of a comparative example.
Figure 3B:
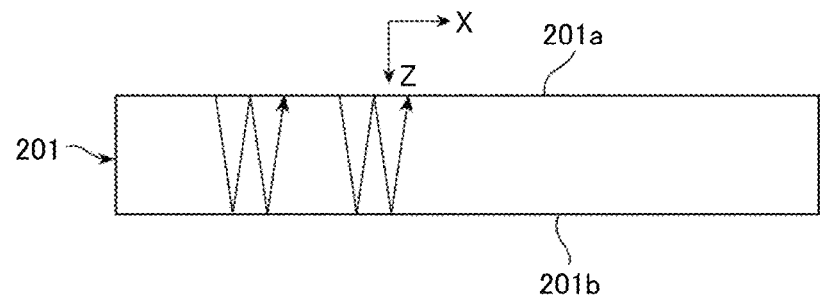
FIG. 3B is a schematic sectional view to explain a bulk wave in a thickness shear mode propagating in a piezoelectric layer of the first preferred embodiment of the present invention.
Figure 4:
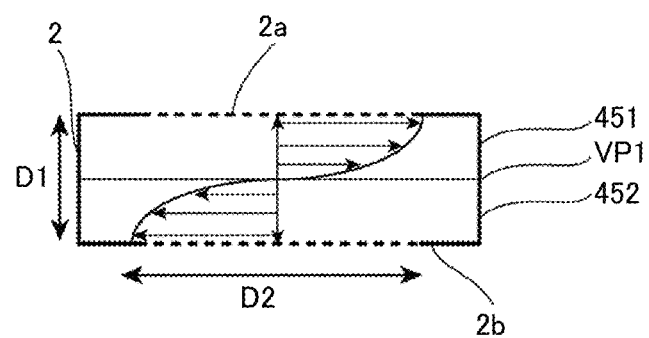
FIG. 4 is a schematic sectional view to explain an amplitude direction of the bulk wave in the thickness shear mode propagating in the piezoelectric layer of the first preferred embodiment of the present invention.

FIG. 3A is a schematic sectional view to explain a Lamb wave propagating in a piezoelectric layer of a comparative example. FIG. 3B is a schematic sectional view to explain the bulk wave in the thickness shear mode propagating in the piezoelectric layer of the first preferred embodiment. FIG. 4 is a schematic sectional view to explain an amplitude direction of the bulk wave in the thickness shear mode propagating in the piezoelectric layer of the first preferred embodiment.

FIG. 3A represents the acoustic wave device disclosed in Japanese Unexamined Patent Application Publication No. 2012-257019 in which the Lamb wave propagates in the piezoelectric layer. As illustrated in FIG. 3A, the wave propagates in a piezoelectric layer 201 as denoted by an arrow. The piezoelectric layer 201 includes a first principal surface 201a and a second principal surface 201b, and a thickness direction connecting the first principal surface 201a and the second principal surface 201b is a Z-direction. An X-direction is a direction in which electrode fingers of IDT (interdigital transducer) electrodes are arranged side by side. As seen from FIG. 3A, the Lamb wave propagates in the X-direction as illustrated. Because the Lamb wave is a plate wave, the piezoelectric layer 201 vibrates in its entirety while the wave propagates in the X-direction. Therefore, resonance characteristics are obtained with reflectors on both sides. Accordingly, a propagation loss of the wave is generated, and the Q-value falls in the case of trying to achieve a reduction in size, namely in the case of reducing the number of pairs of the electrode fingers.

In contrast, in the acoustic wave device of the first preferred embodiment, as illustrated in FIG. 3B, because a vibration displacement occurs in a direction of thickness shear, a wave propagates substantially in a direction connecting the first principal surface 2a and the second principal surface 2b of the piezoelectric layer 2, namely in the Z-direction, and causes resonance. In other words, a component of the wave in the X-direction is much smaller than a component of the wave in the Z-direction. Moreover, since resonance characteristics are obtained with the propagation of the wave in the Z-direction, reflectors are not required. Thus, a propagation loss attributable to the propagation including reflections at the reflectors does not generate. Consequently, a fall of the Q-value is less likely to occur even when the number of electrode pairs each including the electrode 3 and the electrode 4 is reduced to realize a reduction in size.

The amplitude direction of the bulk wave in the thickness shear mode is reversed, as illustrated in FIG. 4, between a first region 451 included in the excitation region C (see FIG. 1B) of the piezoelectric layer 2 and a second region 452 included in the excitation region C. FIG. 4 schematically illustrates the bulk wave when a voltage with a higher potential at the electrode 4 than at the electrode 3 is applied between the electrode 3 and the electrode 4. The first region 451 is a portion of the excitation region C between a virtual plane VP1 extending perpendicular or substantially perpendicular to the thickness direction of the piezoelectric layer 2 and dividing the piezoelectric layer 2 into two portions and the first principal surface 2a. The second region 452 is a portion of the excitation region C between the virtual plane VP1 and the second principal surface 2b.

The acoustic wave device 1 includes at least one pair of electrodes defined by the electrode 3 and the electrode 4. In the acoustic wave device 1, however, since the wave does not propagate in the X-direction, the number of the electrode pairs each defined by the electrode 3 and the electrode 4 is not always required to be multiple. In other words, it is just necessary to provide at least one pair of electrodes.

In an example, the electrode 3 is an electrode connected to a hot potential, and the electrode 4 is an electrode connected to a ground potential. Conversely, the electrode 3 may be connected to the ground potential, and the electrode 4 may be connected to the hot potential. In the first preferred embodiment, each electrode included in at least one pair of the electrodes is the electrode connected to the hot potential or the electrode connected to the ground potential as described above, and a floating electrode is not disposed.

Figure 5:
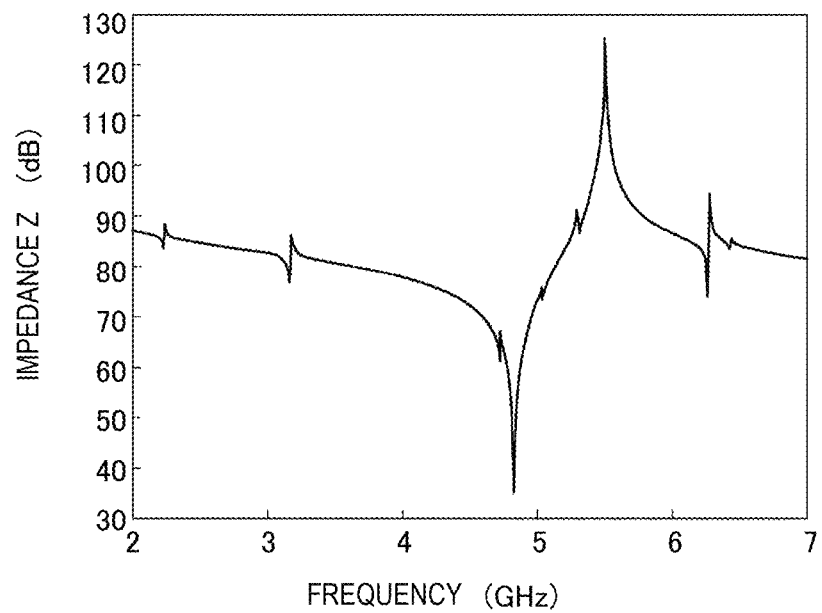
FIG. 5 is an explanatory view indicating an example of resonance characteristics of the acoustic wave device of the first preferred embodiment of the present invention.

FIG. 5 is an explanatory view indicating an example of the resonance characteristics of the acoustic wave device of the first preferred embodiment. Design parameters of the acoustic wave device 1 with which the resonance characteristics indicated in FIG. 5 are obtained are as follows.

Piezoelectric layer 2: LiNbO$_3$ with Euler angles (0°, 0°,) 90°

Thickness of the piezoelectric layer 2: about 400 nm
  Length of the excitation region C (see FIG. 1B): about 40 μm Number of pairs of electrodes including the electrodes 3 and the electrodes 4: 21 pairs Center-to-center distance (pitch) between the electrode 3 and the electrode 4: about 3 μm Width of the electrodes 3 and the electrodes 4: about 500 nm d/p: about 0.133

Intermediate layer 7: silicon oxide film with thickness of about 1 μm

Support member 8: Si

The excitation region C (see FIG. 1B) is a region where the electrode 3 and the electrode 4 overlap with each other when viewed in the X-direction perpendicular or substantially perpendicular to the lengthwise direction of the electrode 3 and the electrode 4. The length of the excitation region C is a dimension of the excitation region C along the lengthwise direction of the electrode 3 and the electrode 4.

In the first preferred embodiment, the electrode-to-electrode distances between the electrodes in pairs each defined by the electrode 3 and the electrode 4 are set to be equal or substantially equal in all the pairs. In other words, the electrodes 3 and the electrodes 4 are arranged at the same or substantially the same pitch.

As is apparent from FIG. 5, good resonance characteristics with a fractional band width of about 12.5% is obtained even though no reflectors are disposed.

Assuming that the thickness of the piezoelectric layer 2 is denoted by d and the center-to-center distance between the electrodes including the electrode 3 and the electrode 4 is denoted by p, d/p is set to be, for example, about 0.5 or less and more preferably about 0.24 or less in the first preferred embodiment. The reason is described below with reference to FIG. 6.

Figure 6:
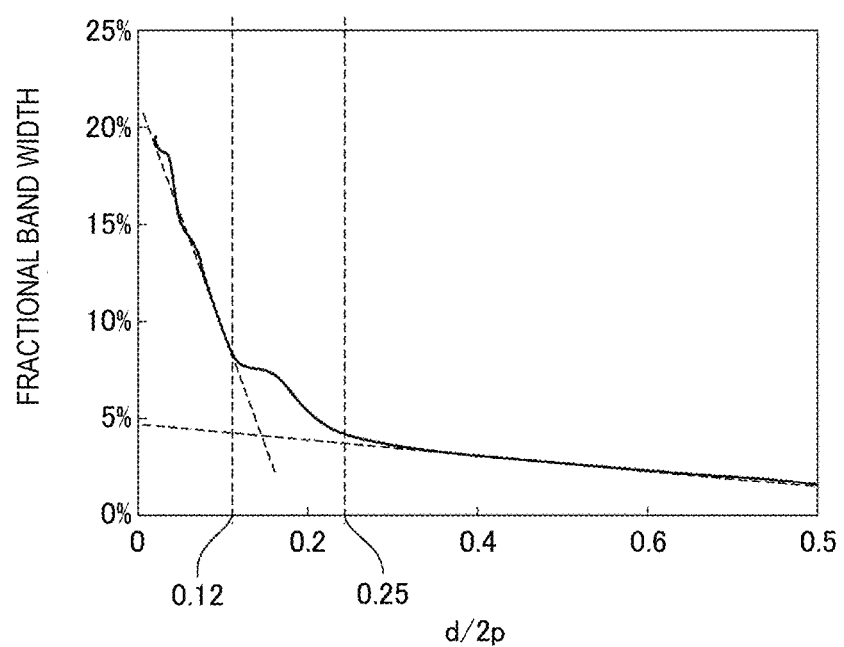
FIG. 6 is an explanatory view indicating a relationship between d/2p and a fractional band width in operation as a resonator where, in the acoustic wave device of the first preferred embodiment of the present invention, a center-to-center distance between adjacent electrodes or an average value of center-to-center distances therebetween is denoted by p and an average thickness of the piezoelectric layer is d.

Multiple acoustic wave devices were fabricated in a similar manner to the acoustic wave device with the resonance characteristics indicated in FIG. 5 except for changing d/2p. FIG. 6 is an explanatory view indicating a relationship between d/2p and the fractional band width in operation as a resonator on an assumption that, in the acoustic wave device of the first preferred embodiment, the center-to-center distance between the adjacent electrodes or an average value of the center-to-center distances therebetween is denoted by p and an average thickness of the piezoelectric layer is d.

As indicated in FIG. 6, if d/2p exceeds about 0.25, namely in the case of d/p > about 0.5, the fractional band width is less than about 5% regardless of adjustment of d/p. On the other hand, in the case of d/2p ≤ about 0.25, namely d/p ≤ about 0.5, the fractional band width can be increased to about 5% or more by changing d/p in the above-mentioned range, and thus a resonator with a higher coupling coefficient can be provided. Furthermore, when d/2p is about 0.12 or less, namely when d/p is about 0.24 or less, the fractional band width can be increased to about 7% or more. In addition, by adjusting d/p in the above-mentioned range, a resonator with an even wider fractional band width can be obtained, and a resonator with an even higher coupling coefficient can be achieved. Thus, it is understood that a resonator utilizing the bulk wave in the thickness shear mode and having a high coupling coefficient can be provided by setting d/p to be about 0.5 or less.

The at least one pair of electrodes may be one pair of electrodes. In the case of one pair of electrodes, the above-mentioned parameter p is defined as the center-to-center distance between the electrode 3 and the electrode 4 adjacent to each other. In the case of 1.5 or more pairs of electrodes, p may be defined as an average value of the center-to-center distances between adjacent twos among the electrode(s) 3 and the electrode(s) 4.

Regarding the thickness d of the piezoelectric layer, when the piezoelectric layer 2 has a variation in thickness, an average thickness value may be used in a similar manner.

Figure 7:
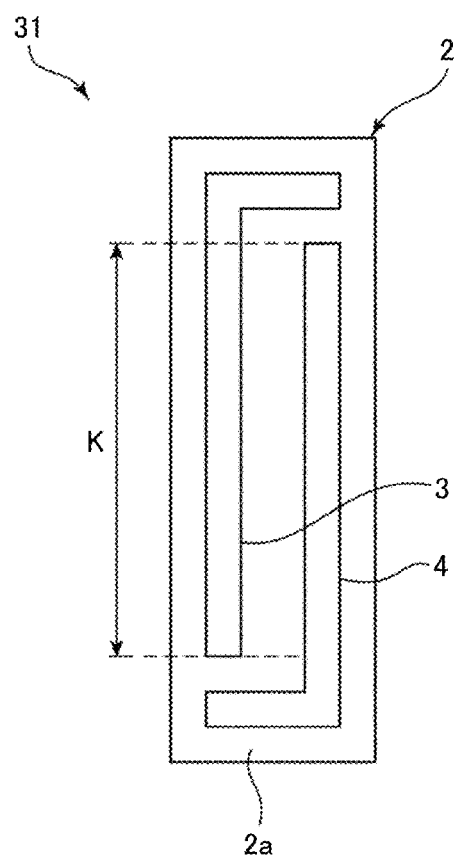
FIG. 7 is a plan view illustrating an example in which one pair of electrodes are disposed in the acoustic wave device of the first preferred embodiment of the present invention.

FIG. 7 is a plan view illustrating an example in which one pair of electrodes are disposed in the acoustic wave device of the first preferred embodiment. In an acoustic wave device 31, one pair of electrodes including the electrode 3 and the electrode 1 are disposed on the first principal surface 2a of the piezoelectric layer 2. K in FIG. 7 denotes an intersecting width. As described above, in acoustic wave devices according to preferred embodiments of the present invention, the number of pairs of electrodes may be one. In that case as well, when d/p is about 0.5 or less, the bulk wave in the thickness shear mode can be effectively excited.

Figure 8:
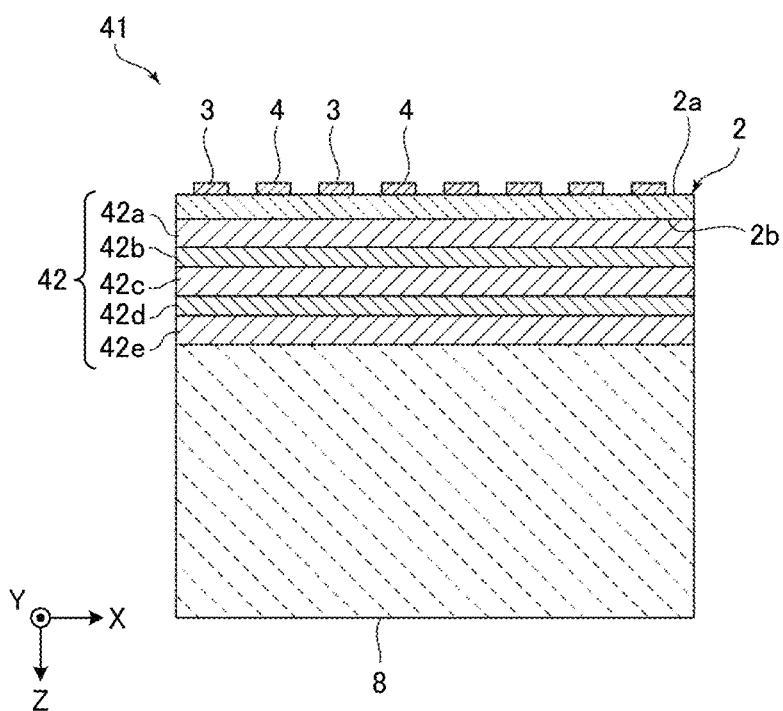
FIG. 8 represents a first modification of the first preferred embodiment of the present invention and is a sectional view taken along the cross-section denoted by the line II-II in FIG. 1A.

FIG. 8 represents a first modification of the first preferred embodiment and is a sectional view taken along the cross-section denoted by the line II-II in FIG. 1A. As illustrated in FIG. 8, in an acoustic wave device 41, an acoustic multilayer film 42 is laminated on the second principal surface 2b of the piezoelectric layer 2. The acoustic multilayer film 42 has a multilayer structure including low acoustic impedance layers 42a, 42c, and 42e each having relatively low acoustic impedance and high acoustic impedance layers 42b and 42d each having relatively high acoustic impedance. With the acoustic multilayer film 42, a bulk wave in a thickness shear primary mode can be enclosed within the piezoelectric layer 2 without using the cavity 9 in the acoustic wave device 1. In the acoustic wave device 41 as well, resonance characteristics based on the bulk wave in the thickness shear primary mode can be obtained by setting d/p to be about 0.5 or less. In the acoustic multilayer film 42, the number of the low acoustic impedance layers 42a, 42c, and 42e to be laminated and the number of the high acoustic impedance layers 42b and 42d to be laminated are not limited to particular values. It is only required that at least one of the high acoustic impedance layers 42b and 42d is disposed on a side farther away from the piezoelectric layer 2 than the low acoustic impedance layers 42a, 42c, and 42e.

The low acoustic impedance layers 42a, 42c, and 42e and the high acoustic impedance layers 42b and 42d can be made of any suitable materials as long as the above-described relationship with regards to the acoustic impedance is satisfied. For example, silicon oxide or silicon oxynitride can be used as the material of the low acoustic impedance layers 42a, 42c, and 42e. For example, alumina, silicon nitride, or a metal can be used as the material of the high acoustic impedance layers 42b and 42d.

In the acoustic wave device 1, preferably, assuming the excitation region C to be a region where any adjacent two among the electrode 3 and the electrode 4 overlap with each other when viewed in the opposing direction of the electrode 3 and the electrode 4, a metallization ratio MR of those two adjacent electrodes 3 and 4 to the excitation region C satisfies MR ≤1.75 (d/p)+0.075. In such a case, spurious modes can be effectively reduced. The above point will be described below with reference to FIGS. 9 and 10.

Figure 9:
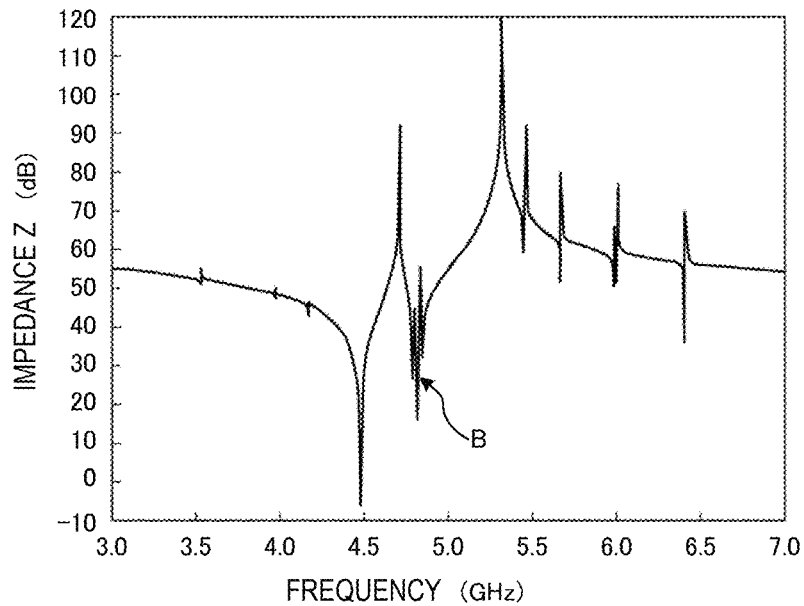
FIG. 9 is a reference view indicating an example of the resonance characteristics of the acoustic wave device of the first preferred embodiment of the present invention.

FIG. 9 is a reference view indicating an example of the resonance characteristics of the acoustic wave device of the first preferred embodiment. Spurious wave denoted by an arrow B appears between a resonant frequency and an anti-resonant frequency. The indicated example is obtained on condition of d/p=0.08 and LiNbO$_3$ having the Euler angles (0°, 0°,) 90°. Moreover, the metallization ratio MR is set to MR=0.35.

The metallization ratio MR is described with reference to FIG. 1B. It is assumed, looking at one pair of the electrode 3 and the electrode 4 in the electrode structure of FIG. 1B, that only the one pair of the electrode 3 and the electrode 4 are provided. In this case, a portion surrounded by a one-dot-chain line is the excitation region C. More specifically, the excitation region C is a region of the electrode 3 where the electrode 3 overlaps with the electrode 4 when the electrode 3 and the electrode 4 are viewed in the direction perpendicular or substantially perpendicular to the lengthwise direction of the electrode 3 and the electrode 4, namely in the opposing direction of both the electrodes, a region of the electrode 4 where the electrode 4 overlaps with the electrode 3, and a region between the electrode 3 and the electrode 4 where the electrode 3 and the electrode 4 overlap with each other. The metallization ratio MR is a ratio of an area of both of the electrode 3 and the electrode 4 within the excitation region C to an area of the excitation region C. In other words, the metallization ratio MR is a ratio of an area of metallized portions to the area of the excitation region C.

When multiple pairs of the electrodes 3 and the electrodes 4 are disposed, a proportion of the metallized portions included in the excitation regions C with respect to a total area of the excitation regions C may be used as the MR.

Figure 10:
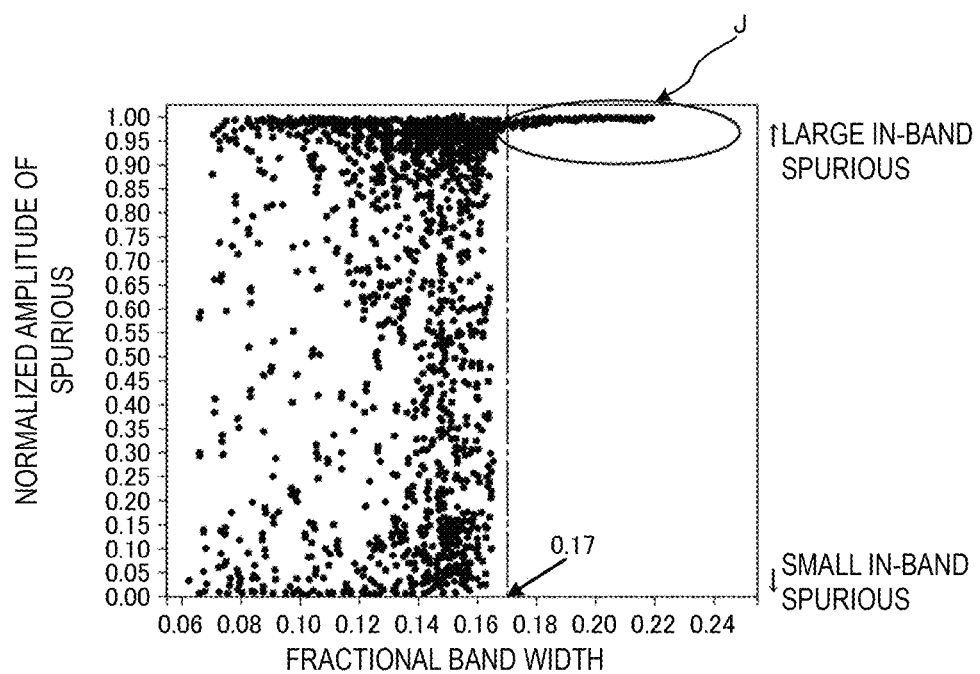
FIG. 10 is an explanatory view indicating a relationship between the fractional band width and a magnitude of spurious modes, namely a phase rotation amount of spurious impedance normalized on the basis of 180 degrees, when many acoustic wave resonators are provided.

FIG. 10 is an explanatory view indicating a relationship between the fractional band width and a magnitude of spurious modes, namely a phase rotation amount of spurious impedance normalized on the basis of 180 degrees, when many acoustic wave resonators are included in the acoustic wave device of the first preferred embodiment. Here, the fractional band width is adjusted by variously changing the film thickness of the piezoelectric layer 2 and the dimensions of the electrode 3 and the electrode 4. While FIG. 10 indicates a result in an example of using the piezoelectric layer 2 made of Z cut LiNbO$_3$, a similar tendency is also obtained in the case of using the piezoelectric layer 2 with other cut-angles.

In a region surrounded by an ellipse J in FIG. 10, the spurious wave is as large as about 1.0. As is apparent from FIG. 10, when the fractional band width exceeds about 0.17, namely about 17%, large spurious modes with a spurious level of 1 or more appears in a pass band even when the parameters for the fractional band width are changed. In other words, as in the resonance characteristics indicated in FIG. 9, the large spurious modes denoted by the arrow B appears in the band. Accordingly, the fractional band width is preferably set to be about 17% or less. In that case, the spurious modes can be reduced by adjusting the film thickness of the piezoelectric layer 2 and the dimensions of the electrode 3 and the electrode 4.

Figure 11:
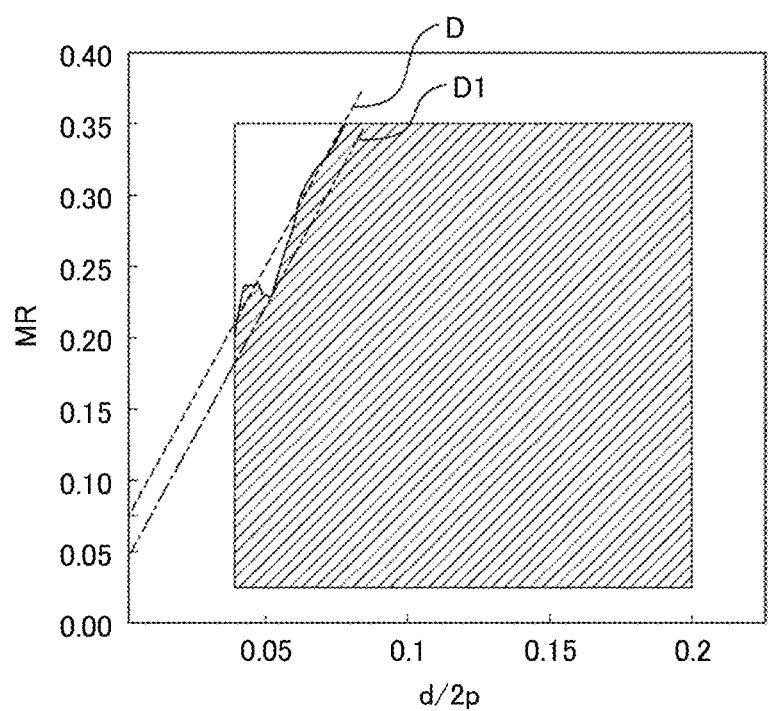
FIG. 11 is an explanatory view indicating relationships among d/2p, a metallization ratio MR, and the fractional band width.

FIG. 11 is an explanatory view indicating relationships among d/2p, the metallization ratio MR, and the fractional band width. In accordance with the acoustic wave device 1 of the first preferred embodiment, various types of acoustic wave devices 1 with d/2p and MR set to different values were fabricated, and fractional band widths were measured.

A portion denoted by hatching on a right side of a dashed line D in FIG. 11 represents a region where the fractional band width is about 17% or less. A boundary between the hatched region and a not-hatched region is expressed by MR=3.5 (d/2p)+0.075. In a different form, the boundary is expressed by MR=1.75 (d/p)+0.075. Thus, MR≤1.75 (d/p)+ 0.075 is preferably satisfied. In this case, the fractional band width can be easily made about 17% or less. It is more preferable to utilize a region on a right side of a one-dot-chain line D1, in FIG. 11, which is expressed by MR=3.5 (d/2p)+0.05. Stated another way, when MR≤1.75 (d/p)+0.05 is satisfied, the fractional band width can be reliably made about 17% or less.

Figure 12:
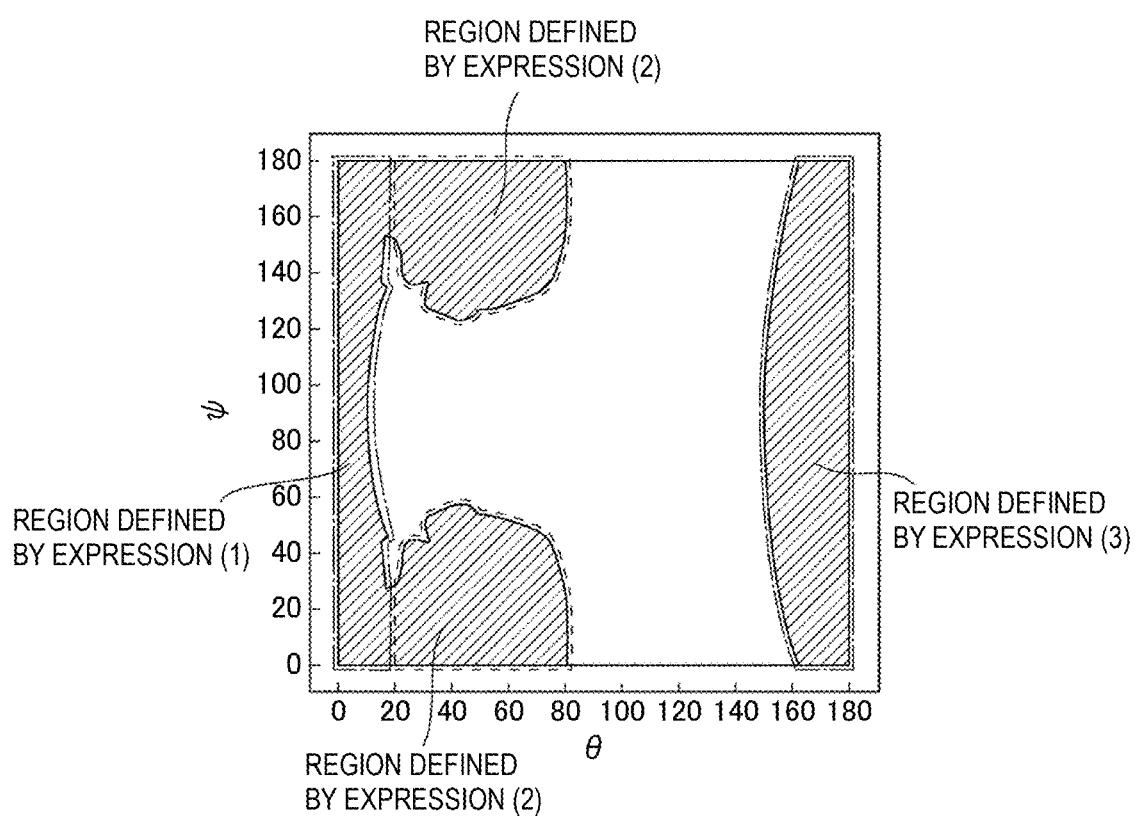
FIG. 12 is an explanatory view indicating a map of the fractional band width with respect to Euler angles (0°, θ, ψ) of $LiNbO_3$ when d/p is assumed to be as close as possible to 0.

FIG. 12 is an explanatory view indicating a map of the fractional band width with respect to Euler angles (0°, 0, ψ) of LiNbO$_3$ when d/p is assumed to be as close as possible to 0. Portions denoted by hatching in FIG. 12 represent regions where the fractional band width of at least about 5% or more is obtained. Extents of those regions are approximately defined by the following expressions (1), (2), and (3).

$$(0°\pm10°, 0° \text{ to } 20°, \text{ arbitrary } \psi) \quad (1)$$

$$(0°\pm10°, 20° \text{to } 80°, 0° \text{to } 60°(1-(\theta-50)^2/900)^{1/2})$$
$$\text{or}(0°\pm10°, 20° \text{to } 80°, [180°-60°(1-(\theta-50)^2/900)^{1/2}] \text{to } 180°) \quad (2)$$

$$(0°\pm10°, [180°-30° (1-(\psi-90)^2/8100)^{1/2}] \text{ to } 180°, \text{arbitrary } \psi) \quad (3)$$

Thus, the Euler angles preferably fall within an Euler angle range defined by the above-described expression (1), (2), or (3) for the reason that the fractional band width can be sufficiently widened in such a case.

As described above, the bulk wave in the thickness shear mode is utilized in the acoustic wave devices 1, 31, and 41. Furthermore, in the acoustic wave devices 1, 31, and 41, the first electrode 3 and the second electrode 4 are adjacent electrodes, and d/p is set to be about 0.5 or less on the assumption that the thickness of the piezoelectric layer is denoted by d and the center-to-center distance between the first electrode 3 and the second electrode 4 is denoted by p. With that feature, the Q-value can be increased in spite of a reduction in size of the acoustic wave devices.

In the acoustic wave devices 1, 31, and 41, the piezoelectric layer 2 is made of lithium niobate or lithium tantalate, for example. The first electrode 3 and the second electrode 4 are disposed on the first principal surface 2a or the second principal surface 2b of the piezoelectric layer 2 to be positioned opposite to each other in the direction intersecting the thickness direction of the piezoelectric layer 2. A protective film preferably covers the first electrode 3 and the second electrode 4.

Figure 13:
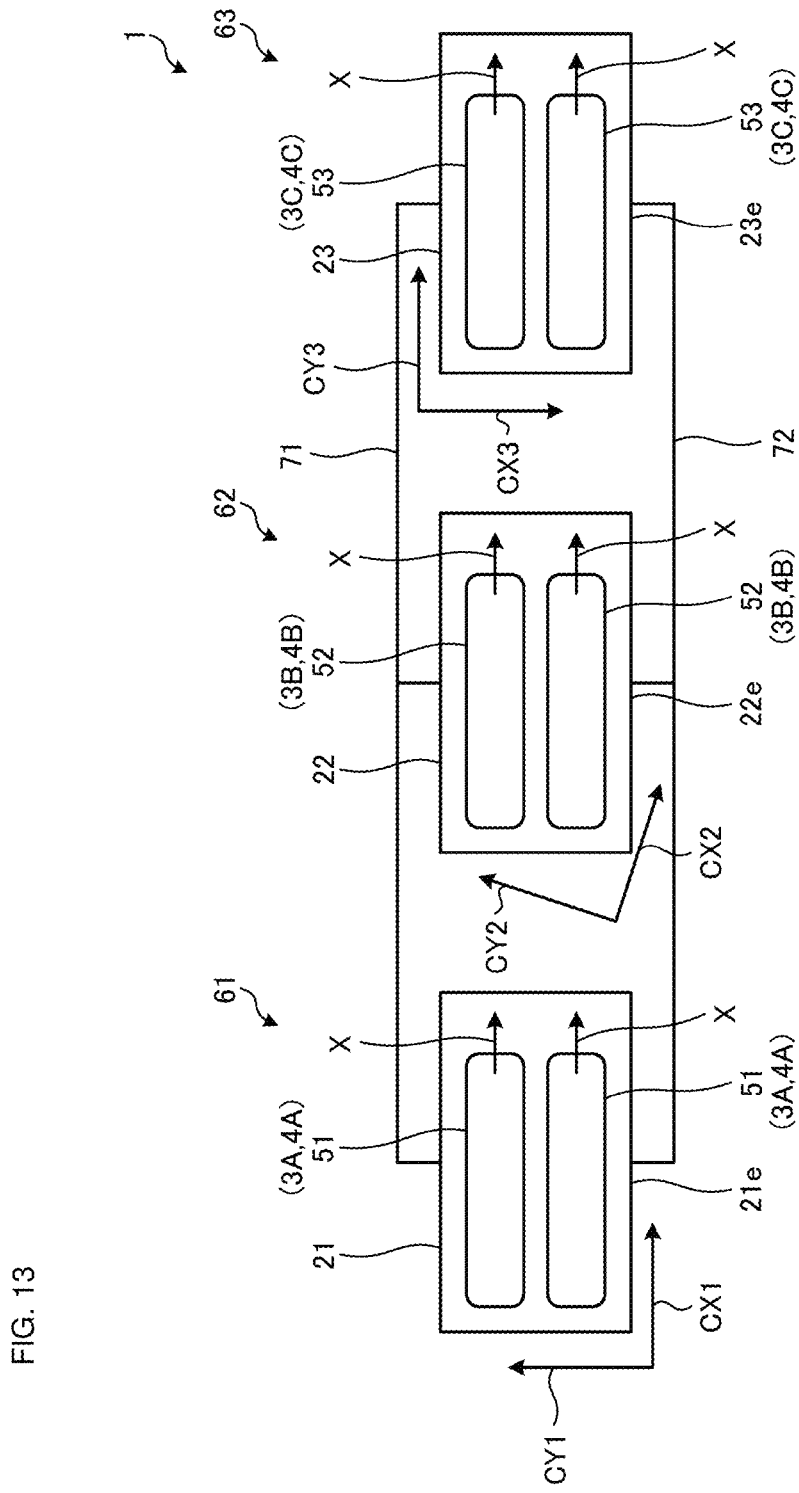
FIG. 13 is an explanatory view to explain a configuration example of the acoustic wave device of the first preferred embodiment of the present invention.
Figure 14:
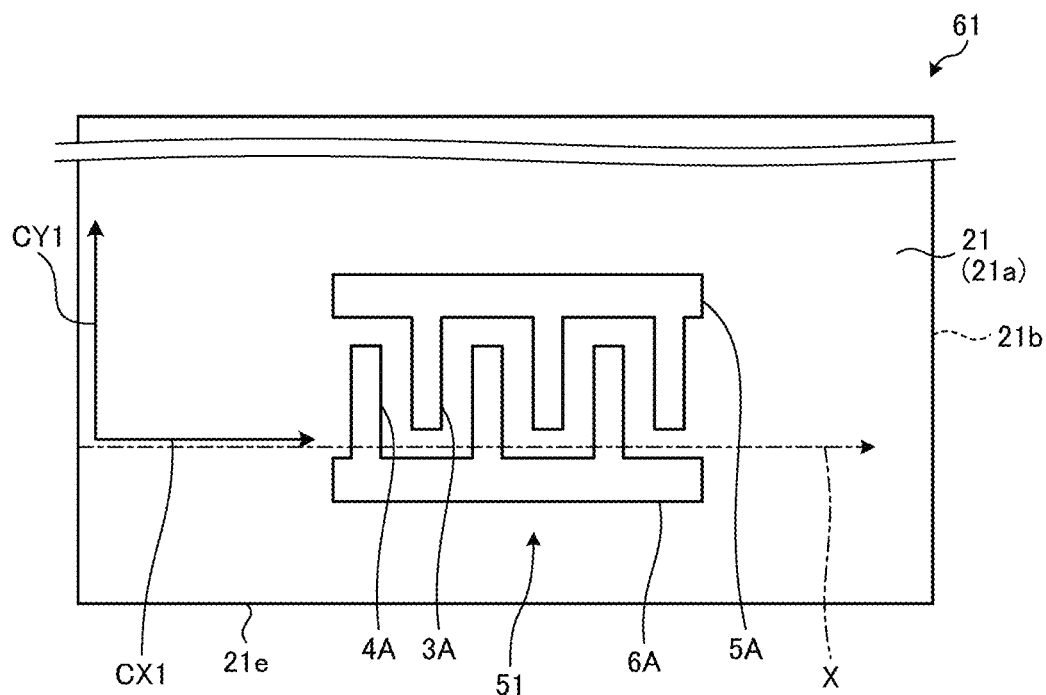
FIG. 14 is a plan view illustrating a portion of a first chip included in the acoustic wave device of the first preferred embodiment of the present invention.
Figure 15:
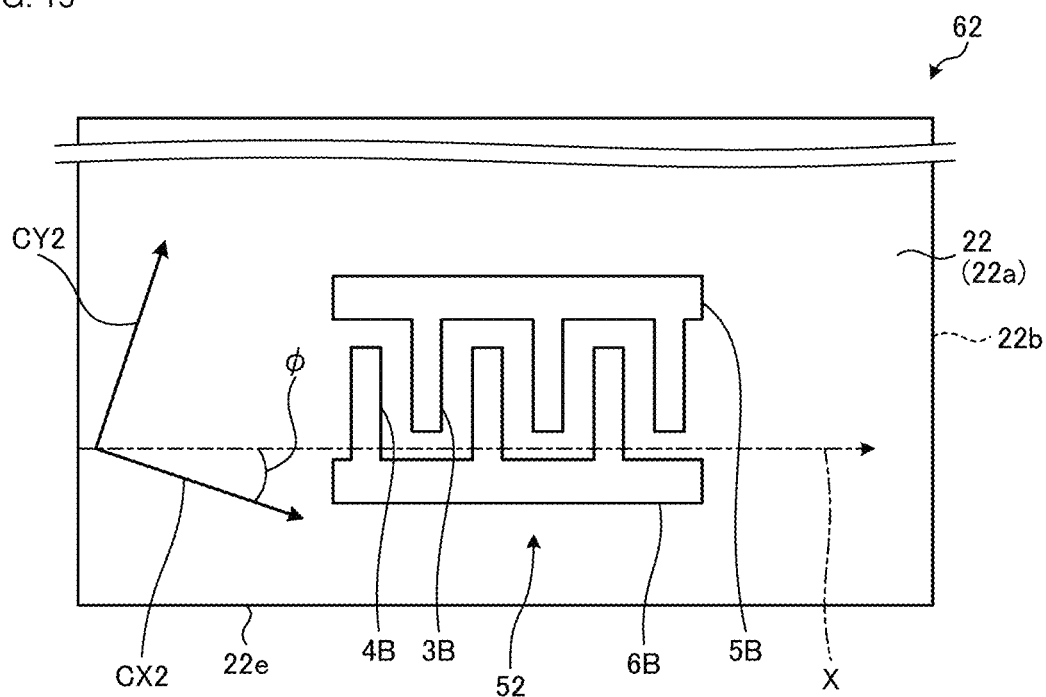
FIG. 15 is a plan view illustrating a portion of a second chip included in the acoustic wave device of the first preferred embodiment of the present invention.

A configuration of the acoustic wave device 1 including multiple piezoelectric layers (chips) will be described below. FIG. 13 is an explanatory view to explain an example of the acoustic wave device of the first preferred embodiment. FIG. 14 is a plan view illustrating a portion of a first chip included in the acoustic wave device of the first preferred embodiment. FIG. 15 is a plan view illustrating a portion of a second chip included in the acoustic wave device of the first preferred embodiment.

As illustrated in FIG. 13, the acoustic wave device 1 includes a first chip 61, a second chip 62, a third chip 63, and connection wirings 71 and 72. The first chip 61, the second chip 62, and the third chip 63 are connected in parallel through the connection wirings 71 and 72. Stated another way, a first acoustic wave resonator 51, a second acoustic wave resonator 52, and a third acoustic wave resonator 53 included in the individual chips are connected in parallel through the connection wirings 71 and 72. The wording "multiple chips (acoustic wave resonators) are connected in parallel" indicates a configuration in which respective input sides of the first acoustic wave resonator 51, the second acoustic wave resonator 52, and the third acoustic wave resonator 53 included in the chips are connected in parallel through a common wiring (for example, the connection wiring 71) and respective output sides thereof are connected in parallel through a common wiring (for example, the connection wiring 72).

As illustrated in FIGS. 13 and 14, the first chip 61 includes a first piezoelectric layer 21 and at least one pair of a first electrode 3A and a second electrode 4A disposed on a first principal surface 21a of the first piezoelectric layer 21. The first piezoelectric layer 21 and the pair of the first electrode 3A and the second electrode 4A define the first acoustic wave resonator 51. The first acoustic wave resonator 51 further includes a first busbar 5A and a second busbar 6A (see FIG. 14). The first electrode 3A, the second electrode 4A, the first busbar 5A, and the second busbar 6A are structured in the same or substantially the same configuration as the above-described one illustrated in FIG. 1B, and repetitive description is omitted.

As illustrated in FIG. 13, two first acoustic wave resonators 51 are disposed on one first chip 61. A direction (X-direction) perpendicular or substantially perpendicular to a lengthwise direction of the first electrode 3A and the second electrode 4A included in each first acoustic wave resonator 51 is along an outline 21e (long side) of the first piezoelectric layer 21. Directions perpendicular or substantially perpendicular to the lengthwise directions of the first electrodes 3A and the second electrodes 4A in the two first acoustic wave resonators 51 are parallel or substantially parallel to each other. The two first acoustic wave resonators 51 are arranged side by side in the lengthwise direction of the first electrode 3A and the second electrode 4A.

In FIGS. 13 and 14, crystal orientations CX1 and CY1 of the first piezoelectric layer 21 in the first chip 61 are schematically denoted by arrows. The crystal orientation CX1 of the first piezoelectric layer 21 is set along the outline 21e of the first piezoelectric layer 21. In other words, the crystal orientation CX1 of the first piezoelectric layer 21 is set along the direction (X-direction) perpendicular or substantially perpendicular to the lengthwise direction of the first electrode 3A and the second electrode 4A. Moreover, the crystal orientation CY1 of the first piezoelectric layer 21 is set to be perpendicular or substantially perpendicular to the crystal orientation CX1, namely along the lengthwise direction of the first electrode 3A and the second electrode 4A. When the first piezoelectric layer 21 is made of, for example, lithium niobate (LiNbO$_3$) or lithium tantalate (LiTaO$_3$), the crystal orientations CX1 and CY1 correspond to an X-axis and a Y-axis, respectively.

As illustrated in FIGS. 13 and 15, the second chip 62 includes a second piezoelectric layer 22 and at least one pair of a third electrode 3B and a fourth electrode 4B disposed on a first principal surface 22a of the second piezoelectric layer 22. The second piezoelectric layer 22 and the pair of the third electrode 3B and the fourth electrode 4B define the second acoustic wave resonator 52. The second acoustic wave resonator 52 further includes a third busbar 5B and a fourth busbar 6B (see FIG. 15). The third electrode 3B, the fourth electrode 4B, the third busbar 5B, and the fourth busbar 6B are structured in the same or substantially the same configuration as the above-described one illustrated in FIG. 1B, and repetitive description is omitted.

Two second acoustic wave resonators 52 are disposed on one second chip 62. A direction (X-direction) perpendicular or substantially perpendicular to a lengthwise direction of the third electrode 3B and the fourth electrode 4B included in each second acoustic wave resonator 52 is along an outline 22e (long side) of the second piezoelectric layer 22. Directions perpendicular or substantially perpendicular to the lengthwise directions of the third electrodes 3B and the fourth electrodes 4B in the two second acoustic wave resonators 52 are parallel or substantially parallel to each other. The two second acoustic wave resonators 52 are arranged side by side in the lengthwise direction of the third electrode 3B and the fourth electrode 4B.

In FIGS. 13 and 15, crystal orientations CX2 and CY2 of the second piezoelectric layer 22 in the second chip 62 are schematically denoted by arrows. The crystal orientation CX2 of the second piezoelectric layer 22 is set to be inclined relative to the outline 22e of the second piezoelectric layer 22. In other words, the crystal orientation CX2 of the second piezoelectric layer 22 is inclined at an angle ɸ relative to the direction (X-direction) perpendicular or substantially perpendicular to the lengthwise direction of the third electrode 3B and the fourth electrode 4B. Moreover, the crystal orientation CY2 of the second piezoelectric layer 22 is set to be perpendicular or substantially perpendicular to the crystal orientation CX2 and to be inclined at the angle ϕ relative to the lengthwise direction of the third electrode 3B and the fourth electrode 4B.

As illustrated in FIG. 13, the third chip 63 includes a third piezoelectric layer 23 and at least one pair of a fifth electrode 3C and a sixth electrode 4C disposed on a first principal surface 23a of the third piezoelectric layer 23. The third piezoelectric layer 23 and the pair of the fifth electrode 3C and the sixth electrode 4C define the third acoustic wave resonator 53. Although not illustrated, the third acoustic wave resonator 53 further includes a fifth busbar and a sixth busbar. The fifth electrode 3C, the sixth electrode 4C, the fifth busbar, and the sixth busbar are structured in the same or substantially the same configuration as the above-described one in the first acoustic wave resonator 51 and the second acoustic wave resonator 52 illustrated in FIGS. 14 and 15.

Two third acoustic wave resonators 53 are disposed on one third chip 63. A direction (X-direction) perpendicular or substantially perpendicular to a lengthwise direction of the fifth electrode 3C and the sixth electrode 4C included in each third acoustic wave resonator 53 is along an outline 23e (long side) of the third piezoelectric layer 23. Directions perpendicular or substantially perpendicular to the lengthwise directions of the fifth electrodes 3C and the sixth electrodes 4C in the two third acoustic wave resonators 53 are parallel or substantially parallel to each other. The two third acoustic wave resonators 53 are arranged side by side in the lengthwise direction of the fifth electrode 3C and the sixth electrode 4C.

In FIG. 13, crystal orientations CX3 and CY3 of the third piezoelectric layer 23 in the third chip 63 are schematically denoted by arrows. The crystal orientation CX3 of the third piezoelectric layer 23 is set to be perpendicular or substantially perpendicular to the outline 23e (long side) of the third piezoelectric layer 23. In other words, the crystal orientation CX3 of the third piezoelectric layer 23 is set along the lengthwise direction of the fifth electrode 3C and the sixth electrode 4C. Moreover, the crystal orientation CY3 of the third piezoelectric layer 23 is set to be perpendicular or substantially perpendicular to the crystal orientation CX3, namely along the direction (X-direction) perpendicular or substantially perpendicular to the lengthwise direction of the fifth electrode 3C and the sixth electrode 4C.

As described above, in the acoustic wave device 1, an angle (for example, about) 0° between the crystal orientation CX1 of the first piezoelectric layer 21 and the direction (X-direction) perpendicular or substantially perpendicular to the lengthwise direction of the pair of the first electrode 3A and the second electrode 4A is different from an angle (for example, about) 40° between the crystal orientation CX2 of the second piezoelectric layer 22 and the direction (X-direction) perpendicular or substantially perpendicular to the lengthwise direction of the pair of the third electrode 3B and the fourth electrode 4B. Moreover, the angle (for example, about) 0° between the crystal orientation CX1 of the first piezoelectric layer 21 and the direction (X-direction) perpendicular or substantially perpendicular to the lengthwise direction of the pair of the first electrode 3A and the second electrode 4A is different from an angle (for example, about) 90° between the crystal orientation CX3 of the third piezoelectric layer 23 and the direction (X-direction) perpendicular or substantially perpendicular to the lengthwise direction of the pair of the fifth electrode 3C and the sixth electrode 4C.

With the configuration described above, in the acoustic wave device 1, strengths and frequencies of spurious modes generated in the individual chips can be made different from one another and can be dispersed. Accordingly, in comparison with the case in which the first chip 61, the second chip 62, and the third chip 63 are structured in the same configuration, the strength of spurious modes can be reduced or prevented overall without deteriorating the resonance characteristics of a main mode. As a result, the acoustic wave device 1 can be suitably applied to the case of structuring a bandpass filter by using the first acoustic wave resonator 51, the second acoustic wave resonator 52, and the third acoustic wave resonator 53. In such a case, since the spurious modes are reduced, deterioration of filter characteristics can be reduced or prevented.

In FIG. 13, two acoustic wave resonators are disposed in each of the first chip 61, the second chip 62, and the third chip 63. However, the present invention is not limited to that case, and one or three or more acoustic wave resonators may be disposed in each chip. When multiple acoustic wave resonators are disposed in each chip, the acoustic wave resonators in each chip may be connected in parallel or in series. The number and connection configuration of the acoustic wave resonators in each chip can be changed as appropriate depending on the filter characteristics demanded for the acoustic wave device 1. While the acoustic wave device 1 includes three chips, namely the first chip 61, the second chip 62, and the third chip 63, the present invention is not limited to that case, and the acoustic wave device 1 is just required to include at least two chips.

Figure 16:
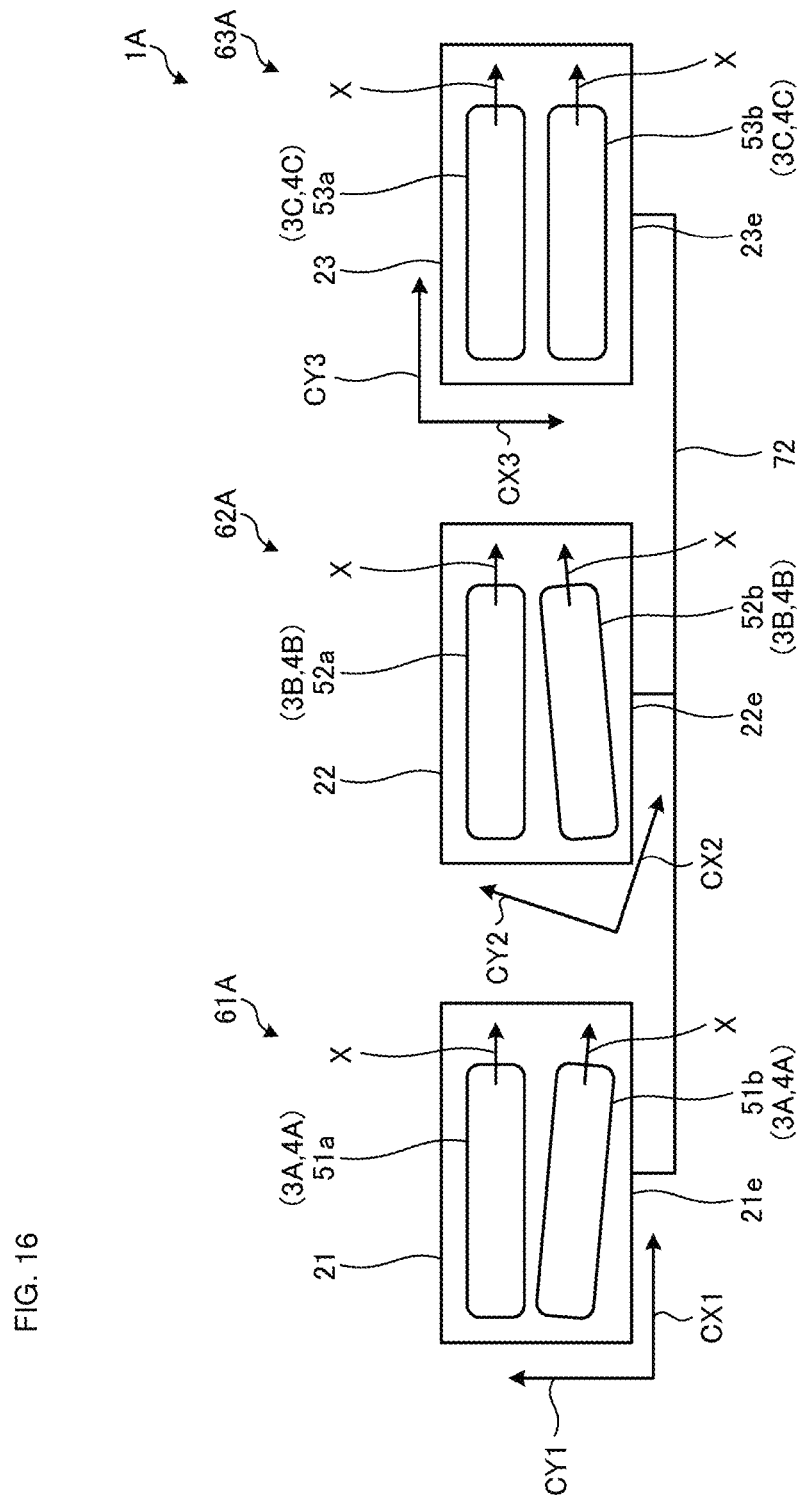
FIG. 16 is an explanatory view to explain an example of an acoustic wave device according to a second modification of the first preferred embodiment of the present invention.

FIG. 16 is an explanatory view to explain an example of an acoustic wave device according to a second modification of the first preferred embodiment. As illustrated in FIG. 16, an acoustic wave device 1A according to the second modification is structured such that, in two first acoustic wave resonators 51a and 51b included in a first chip 61A, directions (X-direction) perpendicular or substantially perpendicular to the lengthwise directions of the first electrodes 3A and the second electrodes 4A in the first acoustic wave resonators 51a and 51b are along the outline 21e of the first piezoelectric layer 21. Here, the wording "along the outline 21e of the first piezoelectric layer 21" indicates that an angle between an extension direction of any side of the first piezoelectric layer 21, the side defining the outline 21e, and the direction (X-direction) perpendicular or substantially perpendicular to the lengthwise direction of the first electrode 3A and the second electrode 4A in the first acoustic wave resonator 51 is within about 0°+10°.

In the second modification illustrated in FIG. 16, for example, looking at one first acoustic wave resonator 51a in the first chip 61A, one second acoustic wave resonator 52a in the second chip 62A, and both third acoustic wave resonators 53a and 53b in the third chip 63A, an angle between a direction (X-direction) perpendicular or substantially perpendicular to the lengthwise direction of each of the electrodes in those resonators and an extension direction of a long side defining each of respective outlines 21e, 22e, and 23e of the individual chips is about 0°.

Furthermore, for example, in the other first acoustic wave resonator 51b in the first chip 61A and the other second acoustic wave resonator 52b in the second chip 62A, an angle between a direction (X-direction) perpendicular or substantially perpendicular to the lengthwise direction of each of the electrodes in those resonators and the extension direction of the long side defining each of the outlines 21e and 22e of the individual chips is about +5° or about −5°.

Thus, in the configuration of the first chip 61A, the direction (X-direction) perpendicular or substantially perpendicular to the lengthwise direction of the first electrode 3A and the second electrode 4A included in each of the first acoustic wave resonators 51a and 51b is not limited to being parallel or substantially parallel to the outline 21e and may be set along the outline 21e at a predetermined angle therebetween. Moreover, the direction (X-direction) perpendicular or substantially perpendicular to the lengthwise direction of the first electrode 3A and the second electrode 4A in one first acoustic wave resonator 51a and the direction (X-direction) perpendicular or substantially perpendicular to the lengthwise direction of the first electrode 3A and the second electrode 4A in the other first acoustic wave resonator 51b are not limited to being parallel or substantially parallel and may have a predetermined angle (for example, about +5° or about −5° therebetween.

Stated another way, in the same first chip 61A, an angle between the direction (X-direction) perpendicular or substantially perpendicular to the lengthwise direction of the first electrode 3A and the second electrode 4A in the one first acoustic wave resonator 51a and the crystal orientation CX1 of the first piezoelectric layer 21 may have a predetermined angle (for example, about +5° or about −5° relative to an angle between the direction (X-direction) perpendicular or substantially perpendicular to the lengthwise direction of the first electrode 3A and the second electrode 4A in the other first acoustic wave resonator 51b and the crystal orientation CX1 of the first piezoelectric layer 21. The above point is similarly applied to the second chip 62A and the third chip 63A.

Second Preferred Embodiment

Figure 17:
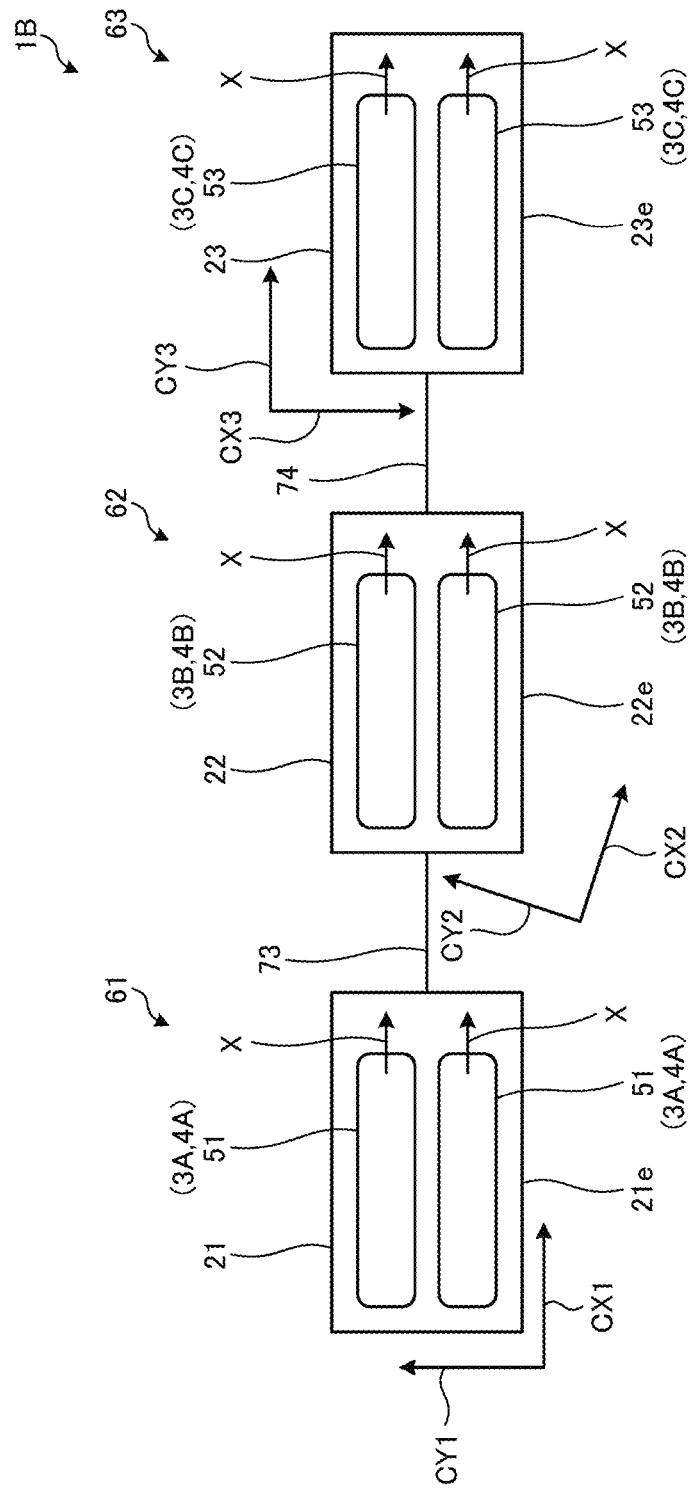
FIG. 17 is an explanatory view to explain an example of an acoustic wave device of a second preferred embodiment of the present invention.

FIG. 17 is an explanatory view to explain an example of an acoustic wave device according to a second preferred embodiment of the present invention. As illustrated in FIG. 17, an acoustic wave device 1B according to the second preferred embodiment described below has a configuration in which the first chip 61, the second chip 62, and the third chip 63 are connected in series unlike the above-described first preferred embodiment and modifications. Each of the first chip 61, the second chip 62, and the third chip 63 has the same or similar configuration to that in the first preferred embodiment, and repetitive description is omitted.

As illustrated in FIG. 17, the first acoustic wave resonator 51 included in the first chip 61 and the second acoustic wave resonator 52 included in the second chip 62 are connected in series through a connection wiring 73. The second acoustic wave resonator 52 included in the second chip 62 and the third acoustic wave resonator 53 included in the third chip 63 are connected in series through a connection wiring 74. In more detail, for example, an output side of the first acoustic wave resonator 51 is connected to an input side of the second acoustic wave resonator 52 through the connection wiring 73. Moreover, an output side of the second acoustic wave resonator 52 is connected to an input side of the third acoustic wave resonator 53 through the connection wiring 74. Input/output connection relationships between the adjacent chips may be reversed to the above-described ones. In the configuration in which the chips are connected in series as in the acoustic wave device 1B, the strengths and the frequencies of the spurious modes generated in the individual chips can also be made different from one another and can be dispersed.

In one first chip 61, the multiple first acoustic wave resonators 51 may be connected in parallel or in series. The multiple second acoustic wave resonators 52 included in the second chip 62 and the multiple third acoustic wave resonators 53 included in the third chip 63 may also be connected in parallel or in series.

Third Preferred Embodiment

Figure 18:
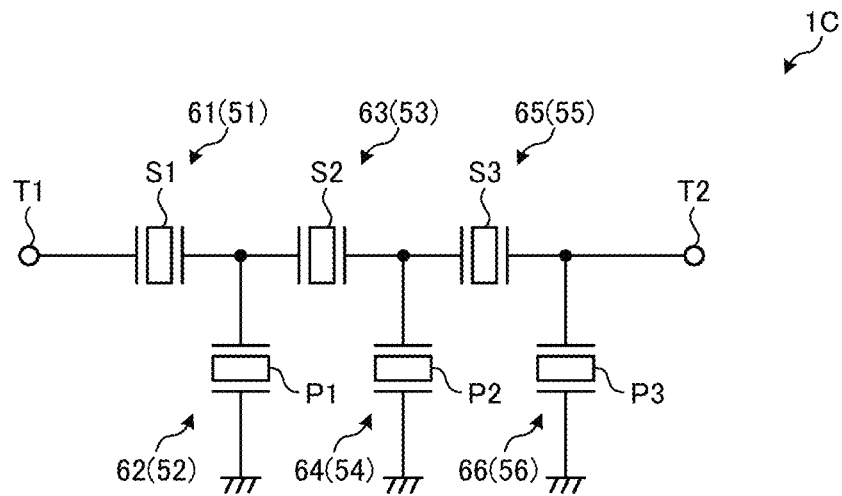
FIG. 18 is an explanatory view to explain as example of an acoustic wave device of a third preferred embodiment of the present invention.

FIG. 18 is an explanatory view to explain an example of an acoustic wave device according to a third preferred embodiment of the present invention. As illustrated in FIG. 18, an acoustic wave device 1C according to the third preferred embodiment described below has a configuration in which multiple chips and acoustic wave resonators are used as a ladder filter unlike the above-described first preferred embodiment, second preferred embodiment, and modifications.

The acoustic wave device 1C is a ladder filter including multiple serial arm resonators S1, S2, and S3 and multiple parallel arm resonators P1, P2, and P3. The serial arm resonators S1, S2, and S3 are connected in series between an input terminal T1 and an output terminal T2. The first chip 61 (first acoustic wave resonator 51), the third chip 63 (third acoustic wave resonator 53), and a fifth chip 65 (fifth acoustic wave resonator 55) are disposed respectively in the serial arm resonators S1, S2, and S3 that interconnect the input terminal T1 and the output terminal T2.

The parallel arm resonators P1, P2, and P3 are connected at one-side ends to the serial arm resonators S1, S2, and S3, respectively, and are connected at the other-side ends to the ground potential. The second chip 62 (second acoustic wave resonator 52), a fourth chip 64 (fourth acoustic wave resonator 54), and a sixth chip 66 (sixth acoustic wave resonator 56) are disposed respectively in the parallel arm resonators P1, P2, and P3 that interconnect the serial arm resonators S1, S2, and S3 and the ground potential.

Thus, the ladder filter with less deterioration of the filter characteristics can be obtained by defining at least one of the serial arm resonators S1, S2, and S3 as the first acoustic wave resonator 51 and by defining at least one of the parallel arm resonators P1, P2, and P3 as the second acoustic wave resonator 52.

The number of the serial arm resonators and the number of the parallel arm resonators in the ladder filter defined by the acoustic wave device 1C of the third preferred embodiment are each not limited to a particular value.

Furthermore, each chip may include multiple acoustic wave resonators as described above (see, for example, FIG. 13). In other words, the serial arm resonators S1, S2, and S3 and the parallel arm resonators P1, P2, and P3 in the ladder filter may each be defined by one pair of acoustic wave resonators. In an example, the first chip 61 (first acoustic wave resonator 51) and the second chip 62 (second acoustic wave resonator 52) in the ladder chip may be a pair of acoustic wave resonators that are formed by dividing one acoustic wave resonator. The pair of acoustic wave resonators may be connected in parallel or in series depending on the demanded filter characteristics.

Fourth Preferred Embodiment

Figure 19:
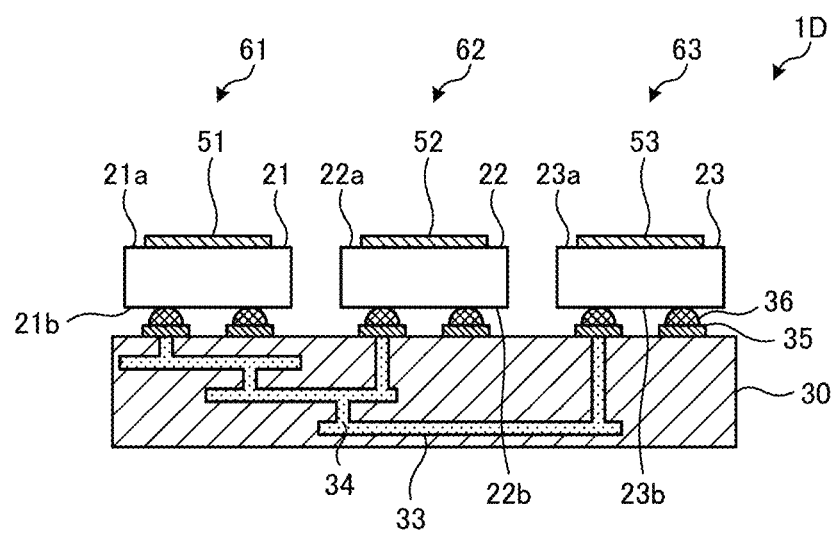
FIG. 19 is an explanatory view to explain an example of an acoustic wave device of a fourth preferred embodiment of the present invention.

FIG. 19 is an explanatory view to explain an example of an acoustic wave device according to a fourth preferred embodiment of the present invention. As illustrated in FIG. 19, in an acoustic wave device 1D according to the fourth preferred embodiment described below, a connection configuration of multiple chips is different from that in the above-described first to third preferred embodiments and modifications.

As illustrated in FIG. 19, the acoustic wave device 1D of the fourth preferred embodiment includes a mounting substrate 30, the first chip 61, the second chip 62, and the third chip 63, those three chips being mounted on the mounting substrate 30. The first chip 61, the second chip 62, and the third chip 63 are disposed such that respective second principal surfaces 21b, 22b, and 23b of the first piezoelectric layer 21, the second piezoelectric layer 22, and the third piezoelectric layer 23 are positioned to face the mounting substrate 30. The second principal surfaces 21b, 22b, and 23b are surfaces on an opposite side to first principal surfaces 21a, 22a, and 23a, respectively.

The first chip 61, the second chip 62, and the third chip 63 are each electrically connected to a mounting electrode 35 on a surface of the mounting substrate 30 with a bump 36 interposed therebetween. The mounting substrate 30 includes multiple dielectric layers and includes multiple wirings 33 and multiple vias 34 to connect the wirings 33. The first chip 61, the second chip 62, and the third chip 63 are electrically connected through the mounting electrodes 35, the wirings 33, and the vias 34.

Figure 20:
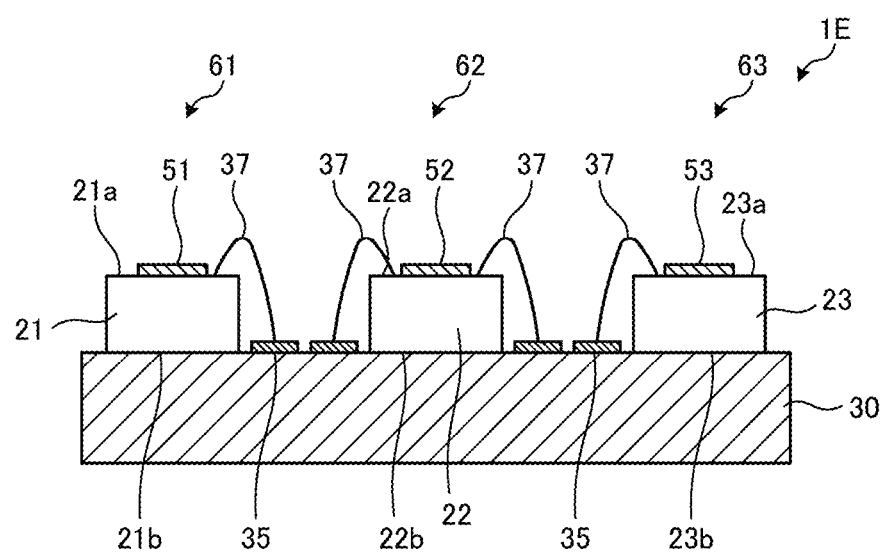
FIG. 20 is an explanatory view to explain an example of an acoustic wave device according to a third modification of the fourth preferred embodiment of the present invention.

FIG. 20 is an explanatory view to explain an example of an acoustic wave device according to a third modification of the fourth preferred embodiment. As illustrated in FIG. 20, an acoustic wave device 1E according to the third modification of the fourth preferred embodiment described below has a configuration in which multiple chips are connected by wire bonding unlike the above-described fourth preferred embodiment.

As illustrated in FIG. 20, the first chip 61, the second chip 62, and the third chip 63 are disposed such that the respective second principal surfaces 21b, 22b, and 23b of the first piezoelectric layer 21, the second piezoelectric layer 22, and the third piezoelectric layer 23 are in contact with a surface of the mounting substrate 30. The first chip 61, the second chip 62, and the third chip 63 are each electrically connected to the mounting electrode 35 on the surface of the mounting substrate 30 through a connection wire 37. The first chip 61, the second chip 62, and the third chip 63 are electrically connected through wirings (not illustrated) disposed on the surface of the mounting substrate 30 or through the wirings 33 and the vias 34 (see FIG. 19) disposed in inner layers of the mounting substrate 30.

The connection configurations of the chips illustrated in FIGS. 19 and 20 are merely examples, and the present invention is not limited to those examples.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave device comprising:
a first piezoelectric layer and a second piezoelectric layer each made of lithium niobate or lithium tantalate and including a first principal surface and a second principal surface opposed to the first principal surface in a thickness direction;
at least one pair of a first electrode and a second electrode on the first principal surface of the first piezoelectric layer and opposed to each other in a planar direction of the first principal surface; and
at least one pair of a third electrode and a fourth electrode on the first principal surface of the second piezoelectric layer and opposed to each other in a planar direction of the first principal surface; wherein
the first piezoelectric layer and the at least one pair of the first electrode and the second electrode define a first acoustic wave resonator;
the second piezoelectric layer and the at least one pair of the third electrode and the fourth electrode define a second acoustic wave resonator; and
an angle between a crystal orientation of the first piezoelectric layer and a direction perpendicular or substantially perpendicular to a lengthwise direction of the at least one pair of the first electrode and the second electrode is different from an angle between a crystal orientation of the second piezoelectric layer and a direction perpendicular or substantially perpendicular to a lengthwise direction of the at least one pair of the third electrode and the fourth electrode.
2. The acoustic wave device according to claim 1, wherein
the direction perpendicular or substantially perpendicular to the lengthwise direction of the at least one pair of the first electrode and the second electrode is a direction along an outline of the first piezoelectric layer; and
the direction perpendicular or substantially perpendicular to the lengthwise direction of the at least one pair of the third electrode and the fourth electrode is a direction along an outline of the second piezoelectric layer.
3. The acoustic wave device according to claim 1, wherein
the acoustic wave device includes a plurality of the first acoustic wave resonators and a plurality of the second acoustic wave resonators;
the plurality of the first acoustic wave resonators are defined by the first piezoelectric layer and a plurality of pairs of the first electrodes and the second electrodes; and
the plurality of the second acoustic wave resonators are defined by the second piezoelectric layer and a plurality of pairs of the third electrodes and the fourth electrodes.
4. The acoustic wave device according to claim 3, wherein
directions perpendicular or substantially perpendicular to lengthwise directions of the plurality of pairs of the first electrodes and the second electrodes defining the plurality of the first acoustic wave resonators are each in the direction along the outline of the first piezoelectric layer; and directions perpendicular or substantially perpendicular to lengthwise directions of the plurality of pairs of the third electrodes and the fourth electrodes defining the plurality of the second acoustic wave resonators are each in the direction along the outline of the second piezoelectric layer.

5. The acoustic wave device according to claim 1, wherein the first acoustic wave resonator and the second acoustic wave resonator are connected in series.

6. The acoustic wave device according to claim 1, wherein the first acoustic wave resonator and the second acoustic wave resonator are connected in parallel.

7. The acoustic wave device according to claim 1, wherein the acoustic wave device includes an input terminal and an output terminal, and the first acoustic wave resonator is located in a serial arm interconnecting the input terminal and the output terminal; and
the second acoustic wave resonator is located in a parallel arm interconnecting the serial arm and a ground potential.

8. The acoustic wave device according to claim 1, wherein the first acoustic wave resonator and the second acoustic wave resonator define a bandpass filter.

9. The acoustic wave device according to claim 8, wherein the bandpass filter is a ladder filter, one of the first acoustic wave resonator and the second acoustic wave resonator defines a serial arm resonator, and one of the first acoustic wave resonator and the second acoustic wave resonator defines a parallel arm resonator.

10. The acoustic wave device according to claim 9, wherein the first acoustic wave resonator and the second acoustic wave resonator are a pair of acoustic wave resonators defined by a divided acoustic wave resonator in the bandpass filter.

11. The acoustic wave device according to claim 1, wherein the acoustic wave device is structured to utilize a bulk wave in a thickness shear mode.

12. The acoustic wave device according to claim 1, wherein Euler angles ($\phi$, $\theta$, $\psi$) of the lithium niobate or the lithium tantalate are within a range defined by an expression (1), (2), or (3) below:

$$(0°\pm10°, 0° \text{ to } 20°, \text{arbitrary } \psi) \quad (1)$$

$$(0°\pm10°, 20° \text{ to } 80°, 0° \text{ to } 60°(1-(\theta-50)^2/900)^{1/2}) \\ \text{or}(0°\pm10°, 20° \text{ to } 80°, [180°-60°(1-(\theta-50)^2/900)^{1/2}] \text{ to } 180° \quad (2)$$

$$(0°\pm10°, [180°-30°(1-(\psi-90)^2/8100)^{1/2}] \text{ to } 180°, \text{arbitrary } \psi) \quad (3).$$

13. An acoustic wave device comprising:
a first piezoelectric layer and a second piezoelectric layer each made of lithium niobate or lithium tantalate and including a first principal surface and a second principal surface opposite to the first principal surface in a thickness direction;
at least one pair of a first electrode and a second electrode on the first principal surface of the first piezoelectric layer and opposed to each other in a planar direction of the first principal surface; and
at least one pair of a third electrode and a fourth electrode on the first principal surface of the second piezoelectric layer and opposed to each other in a planar direction of the first principal surface; wherein
the first piezoelectric layer and the at least one pair of the first electrode and the second electrode define a first acoustic wave resonator;
the second piezoelectric layer and the at least one pair of the third electrode and the fourth electrode define a second acoustic wave resonator;
d/p is about 0.5 or less where an average thickness of each of the first piezoelectric layer and the second piezoelectric layer is denoted by d and center-to-center distances between the first electrode and the second electrode adjacent to each other and between the third electrode and the fourth electrode adjacent to each other are each denoted by p; and
an angle between a crystal orientation of the first piezoelectric layer and a direction perpendicular or substantially perpendicular to a lengthwise direction of the at least one pair of the first electrode and the second electrode is different from an angle between a crystal orientation of the second piezoelectric layer and a direction perpendicular or substantially perpendicular to a lengthwise direction of the at least one pair of the third electrode and the fourth electrode.

14. The acoustic wave device according to claim 13, wherein
the direction perpendicular or substantially perpendicular to the lengthwise direction of the at least one pair of the first electrode and the second electrode is a direction along an outline of the first piezoelectric layer; and
the direction perpendicular or substantially perpendicular to the lengthwise direction of the at least one pair of the third electrode and the fourth electrode is a direction along an outline of the second piezoelectric layer.

15. The acoustic wave device according to claim 13, wherein
the acoustic wave device includes a plurality of the first acoustic wave resonators and a plurality of the second acoustic wave resonators;
the plurality of the first acoustic wave resonators are defined by the first piezoelectric layer and a plurality of pairs of the first electrodes and the second electrodes; and
the plurality of the second acoustic wave resonators are defined by the second piezoelectric layer and a plurality of pairs of the third electrodes and the fourth electrodes.

16. The acoustic wave device according to claim 15, wherein
directions perpendicular or substantially perpendicular to lengthwise directions of the plurality of pairs of the first electrodes and the second electrodes defining the plurality of the first acoustic wave resonators are each in the direction along the outline of the first piezoelectric layer; and
directions perpendicular or substantially perpendicular to lengthwise directions of the plurality of pairs of the third electrodes and the fourth electrodes defining the plurality of the second acoustic wave resonators are each in the direction along the outline of the second piezoelectric layer.

17. The acoustic wave device according to claim 13, wherein the first acoustic wave resonator and the second acoustic wave resonator are connected in series.

18. The acoustic wave device according to claim 13, wherein the first acoustic wave resonator and the second acoustic wave resonator are connected in parallel.

19. The acoustic wave device according to claim 13, wherein
the acoustic wave device includes an input terminal and an output terminal, and the first acoustic wave resonator is located in a serial arm interconnecting the input terminal and the output terminal; and the second acoustic wave resonator is located in a parallel arm interconnecting the serial arm and a ground potential.

20. The acoustic wave device according to claim 13, wherein the first acoustic wave resonator and the second acoustic wave resonator define a bandpass filter.

21. The acoustic wave device according to claim 20, wherein the bandpass filter is a ladder filter, one of the first acoustic wave resonator and the second acoustic wave resonator defines a serial arm resonator, and one of the first acoustic wave resonator and the second acoustic wave resonator defines a parallel arm resonator.

22. The acoustic wave device according to claim 21, wherein the first acoustic wave resonator and the second acoustic wave resonator are a pair of acoustic wave resonators defined by a divided acoustic wave resonator in the bandpass filter.

23. The acoustic wave device according to claim 13, wherein the acoustic wave device is structured to utilize a bulk wave in a thickness shear mode.

24. The acoustic wave device according to claim 13, wherein
an average thickness of each of the first piezoelectric layer and the second piezoelectric layer is denoted by d and center-to-center distances between the first electrode and the second electrode adjacent to each other and between the third electrode and the fourth electrode adjacent to each other are each denoted by p;
an excitation region is defined by a region at which the first electrode and the second electrode overlap each other when viewed in an opposing direction in which the first electrode and the second electrode are opposed to each other; and
a metallization ratio MR denoting a ratio of the first electrode and the second electrode within the excitation region to the excitation region satisfies MR≤1.75 (d/p)+ 0.075.

25. The acoustic wave device according to claim 13, wherein Euler angles ($\phi$, $\theta$, $\psi$) of the lithium niobate or the lithium tantalate are within a range defined by an expression (1), (2), or (3) below:

$$(0°\pm10°, 0° \text{ to } 20°, \text{arbitrary } \psi) \tag{1}$$

$$(0°\pm10°, 20° \text{ to } 80°, 0° \text{ to } 60°(1-(\theta-50)^2/900)^{1/2})$$
$$\text{or}(0°\pm10°, 20° \text{ to } 80°, [180°-60°(1-(\theta-50)^2/900)^{1/2}] \text{ to } 180° \tag{2}$$

$$(0°\pm10°, [180°-30° (1-(\psi-90)^2/8100)^{1/2}] \text{ to } 180°, \text{arbitrary } \psi) \tag{3}.$$

* * * * *